(12) United States Patent
Golda et al.

(10) Patent No.: US 9,391,042 B2
(45) Date of Patent: Jul. 12, 2016

(54) MICRO DEVICE TRANSFER SYSTEM WITH PIVOT MOUNT

(71) Applicant: Luxvue Technology Corporation, Santa Clara, CA (US)

(72) Inventors: Dariusz Golda, Redwood City, CA (US); John A. Higginson, Santa Clara, CA (US); Andreas Bibl, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 401 days.

(21) Appl. No.: 13/715,557

(22) Filed: Dec. 14, 2012

(65) Prior Publication Data

US 2014/0169924 A1    Jun. 19, 2014

(51) Int. Cl.
| | |
|---|---|
| *B23P 19/00* | (2006.01) |
| *H01R 43/042* | (2006.01) |
| *H01L 23/00* | (2006.01) |

(52) U.S. Cl.
CPC ............... *H01L 24/75* (2013.01); *H01L 24/97* (2013.01); *H01L 2224/7598* (2013.01); *H01L 2224/75725* (2013.01); *H01L 2924/12041* (2013.01); *H01L 2924/12042* (2013.01); *H01L 2924/1461* (2013.01); *H01L 2924/351* (2013.01); *Y10T 279/23* (2015.01)

(58) Field of Classification Search
CPC .... B25J 11/00; B25J 15/0085; B25J 15/0052; Y10T 29/53261
USPC .......................................... 29/759; 414/751.1
See application file for complete search history.

(56) References Cited

U.S. PATENT DOCUMENTS

| | | | | |
|---|---|---|---|---|
| 5,592,358 | A | * | 1/1997 | Shamouilian et al. ......... 361/234 |
| 5,839,187 | A | * | 11/1998 | Sato et al. .......................... 29/743 |
| 5,851,664 | A | * | 12/1998 | Bennett et al. ........... 428/355 BL |
| 5,888,847 | A | * | 3/1999 | Rostoker et al. ............... 438/108 |
| 5,903,428 | A | * | 5/1999 | Grimard et al. ................ 361/234 |
| 5,996,218 | A | | 12/1999 | Shamouilian et al. |
| 6,071,795 | A | * | 6/2000 | Cheung et al. ................. 438/458 |
| 6,335,263 | B1 | * | 1/2002 | Cheung et al. ................. 438/455 |
| 6,403,985 | B1 | * | 6/2002 | Fan et al. .......................... 257/88 |
| 6,420,242 | B1 | | 7/2002 | Cheung et al. |
| 6,521,511 | B1 | * | 2/2003 | Inoue et al. .................... 438/458 |
| 6,558,109 | B2 | * | 5/2003 | Gibbel ........................ 414/795.5 |

(Continued)

FOREIGN PATENT DOCUMENTS

| | | |
|---|---|---|
| CN | 101863035 A | 10/2010 |
| JP | 61-265218 A | 11/1986 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Paul D Kim

(74) *Attorney, Agent, or Firm* — Blakely, Sokoloff, Taylor & Zafman LLP

(57) ABSTRACT

Systems and methods for transferring a micro device from a carrier substrate are disclosed. In an embodiment, a micro pick up array mount includes a pivot platform to allow a micro pick up array to automatically align with a carrier substrate. Deflection of the pivot platform may be detected to control further movement of the micro pick up array.

63 Claims, 35 Drawing Sheets

(56) References Cited

U.S. PATENT DOCUMENTS

| | | | |
|---|---|---|---|
| 6,613,610 B2* | 9/2003 | Iwafuchi et al. | 438/128 |
| 6,629,553 B2* | 10/2003 | Odashima et al. | 156/765 |
| 6,670,038 B2* | 12/2003 | Sun et al. | 428/403 |
| 6,786,390 B2* | 9/2004 | Yang et al. | 228/179.1 |
| 6,878,607 B2 | 4/2005 | Inoue et al. | |
| 7,033,842 B2 | 4/2006 | Haji et al. | |
| 7,148,127 B2* | 12/2006 | Oohata et al. | 438/469 |
| 7,205,174 B2* | 4/2007 | Hung | 438/52 |
| 7,208,337 B2* | 4/2007 | Eisert et al. | 438/42 |
| 7,329,930 B2* | 2/2008 | Hung | 257/414 |
| 7,353,596 B2* | 4/2008 | Shida et al. | 29/844 |
| 7,358,158 B2* | 4/2008 | Aihara et al. | 438/464 |
| 7,585,703 B2* | 9/2009 | Matsumura et al. | 438/128 |
| 7,723,764 B2 | 5/2010 | Oohata et al. | |
| 7,795,629 B2* | 9/2010 | Watanabe et al. | 257/89 |
| 7,797,720 B2* | 9/2010 | Gopalakrishnan et al. | 725/88 |
| 7,797,820 B2 | 9/2010 | Shida et al. | |
| 7,838,410 B2* | 11/2010 | Hirao et al. | 438/608 |
| 7,880,184 B2 | 2/2011 | Iwafuchi et al. | |
| 7,884,543 B2* | 2/2011 | Doi | 313/506 |
| 7,888,690 B2 | 2/2011 | Iwafuchi et al. | |
| 7,906,787 B2* | 3/2011 | Kang | 257/85 |
| 7,910,945 B2* | 3/2011 | Donofrio et al. | 257/99 |
| 7,927,976 B2* | 4/2011 | Menard | 438/478 |
| 7,928,465 B2* | 4/2011 | Lee et al. | 257/99 |
| 7,972,875 B2* | 7/2011 | Rogers et al. | 438/21 |
| 7,999,454 B2* | 8/2011 | Winters et al. | 313/500 |
| 8,023,248 B2* | 9/2011 | Yonekura et al. | 361/234 |
| 8,333,860 B1* | 12/2012 | Bibl et al. | 156/249 |
| 8,546,995 B2* | 10/2013 | Hung et al. | 310/309 |
| 8,816,565 B2* | 8/2014 | Hung et al. | 310/309 |
| 2001/0029088 A1* | 10/2001 | Odajima et al. | 438/464 |
| 2002/0076848 A1* | 6/2002 | Spooner et al. | 438/48 |
| 2002/0171901 A1* | 11/2002 | Bernstein | 359/199 |
| 2003/0177633 A1* | 9/2003 | Haji et al. | 29/743 |
| 2005/0232728 A1* | 10/2005 | Rice et al. | 414/217 |
| 2006/0071578 A1* | 4/2006 | Drabe et al. | 310/309 |
| 2006/0082250 A1* | 4/2006 | Ko et al. | 310/309 |
| 2006/0268383 A1* | 11/2006 | Cho et al. | 359/223 |
| 2007/0014920 A1* | 1/2007 | Syms | 427/256 |
| 2007/0166134 A1* | 7/2007 | Suzuki | 414/217 |
| 2007/0166851 A1* | 7/2007 | Tran et al. | 438/22 |
| 2007/0261574 A1* | 11/2007 | Kendale et al. | 101/17 |
| 2008/0163481 A1 | 7/2008 | Shida et al. | |
| 2009/0068774 A1* | 3/2009 | Slater et al. | 438/26 |
| 2009/0314991 A1* | 12/2009 | Cho et al. | 252/301.36 |
| 2010/0142114 A1* | 6/2010 | Purohit et al. | 361/234 |
| 2010/0178139 A1* | 7/2010 | Sundar et al. | 414/225.01 |
| 2010/0188794 A1* | 7/2010 | Park et al. | 361/234 |
| 2010/0248484 A1 | 9/2010 | Bower et al. | |
| 2011/0003410 A1* | 1/2011 | Tsay et al. | 438/27 |
| 2011/0109194 A1* | 5/2011 | Hung et al. | 310/300 |
| 2012/0064642 A1* | 3/2012 | Huang et al. | 438/15 |
| 2012/0134065 A1* | 5/2012 | Furuya et al. | 361/234 |
| 2013/0126081 A1* | 5/2013 | Hu et al. | 156/249 |
| 2013/0126891 A1* | 5/2013 | Bibl et al. | 257/76 |
| 2013/0285086 A1* | 10/2013 | Hu et al. | 257/98 |
| 2014/0084482 A1 | 3/2014 | Hu et al. | |
| 2014/0241844 A1* | 8/2014 | Golda et al. | 414/751.1 |

FOREIGN PATENT DOCUMENTS

| | | |
|---|---|---|
| JP | 3406207 | 5/1999 |
| KR | 10-2001-0026858 A | 4/2001 |
| WO | WO 00-67543 A1 | 11/2000 |
| WO | WO 2008-052594 A1 | 5/2008 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, SanYoul, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald9709.html, 12 pgs.

Widas, Robert, "Electrostatic Substrate Clamping for Next Generation Semiconductor Devices" Apr. 21, 1999, 4 pgs.

PCT International Search Report and Written Opinion for International Application No. PCT/US2013/073917, mailed Mar. 13, 2014, 12 pages.

PCT International Search Report and Written Opinion for International Application No. PCT/US2013/073919, mailed Mar. 27, 2014, 13 pages.

PCT Chapter I International Preliminary Report on Patentability (IPER) for PCT Application No. PCT/US2013/073917, mailed 16 Jun. 2015, 9 pages.

PCT International Search Report and Written Opinion for International Application No. PCT/US2014/016418, mailed May 27, 2014, 10 pages.

* cited by examiner

MICRO DEVICE TRANSFER SYSTEM WITH PIVOT MOUNT

BACKGROUND

1. Field

The present invention relates to micro devices. More particularly, embodiments of the present invention relate to systems and methods for transferring a micro device from a carrier substrate.

2. Background Information

The feasibility of commercializing miniaturized devices such as radio frequency (RF) microelectromechanical systems (MEMS) microswitches, light-emitting diode (LED) display systems, and MEMS or quartz-based oscillators is largely constrained by the difficulties and costs associated with manufacturing those devices. Manufacturing processes typically include wafer based processing and transferring techniques.

Device transferring processes include transfer from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer and bond the devices to a receiving wafer. Following transfer, the transfer wafer may be removed using techniques that include laser lift-off (LLO), grinding or polishing, and etching.

Gimbal mechanisms have been used in wafer polishing equipment to facilitate evenly polishing a wafer. For example, passive gimbal mechanisms in polishing equipment facilitate alignment of wafers with a polishing pad.

SUMMARY OF THE DESCRIPTION

A micro pick up array mount and methods of using the micro pick up array mount to transfer an array of micro devices from a carrier substrate are disclosed. In an embodiment, the micro pick up array mount includes a pivot platform, a base laterally around the pivot platform, and a beam between the pivot platform and the base. The beam may be coupled with the pivot platform at an inner pivot and coupled with the base at an outer pivot. In an embodiment, the outer pivot is on a base edge and the inner pivot is on a pivot platform edge. The base edge may be orthogonal to the pivot platform edge. In an embodiment, a second beam may be coupled with the base by a second outer pivot on a second base edge and coupled with the pivot platform by a second inner pivot on a second pivot platform edge. In an embodiment, the beam is coupled with the pivot platform at a second inner pivot and coupled with the base at a second outer pivot. The inner pivot may be across the pivot platform from the second inner pivot, and the outer pivot may be across the pivot platform from the second outer pivot. In an embodiment, the inner pivots and the outer pivots comprise silicon.

In an embodiment, the micro pick up array mount includes a pivot platform electrostatic voltage source contact on the pivot platform and a base electrostatic voltage source contact on the base. The pivot platform electrostatic voltage source contact may be in electrical connection with the base electrostatic voltage source contact. The micro pick up array mount may also include a trace extending from the pivot platform electrostatic voltage source contact and placing the pivot platform electrostatic voltage source contact may be in electrical connection with the base electrostatic voltage source contact.

In an embodiment, the micro pick up array mount includes a bonding site on the pivot platform. The bonding site may include a clamp electrode in electrical connection with a base clamp contact on the base. In an embodiment, a trace extends from the clamp electrode and places the clamp electrode in electrical connection with the base clamp contact. In an embodiment, the bonding site may include a metal such as gold, copper, and aluminum.

In an embodiment, the micro pick up array mount includes a heating contact on the base and a heating element over the pivot platform in electrical connection with the heating contact. The micro pick up array mount may also include a temperature sensor on the pivot platform.

A micro device transfer system and methods of using the micro device transfer system to transfer an array of micro devices from a carrier substrate are disclosed. In an embodiment, the micro device transfer system includes a micro pick up array mount having a pivot platform, a base laterally around the pivot platform, and a beam between the pivot platform and the base. The beam may be coupled with the pivot platform at an inner pivot and coupled with the base at an outer pivot. The micro device transfer system may also include a micro pick up array having a substrate supporting an array of electrostatic transfer heads. The micro pick up array may be joinable with the micro pick up array mount. In an embodiment, the outer pivot may be on a base edge and the inner pivot may be on a pivot platform edge. The base edge may be orthogonal to the pivot platform edge. In an embodiment, the micro device transfer system includes a second beam coupled with the base by a second outer pivot on a second base edge and coupled with the pivot platform by a second inner pivot on a second pivot platform edge. In an embodiment, the beam may be coupled with the pivot platform at a second inner pivot and coupled with the base at a second pivot. The inner pivot may be across the pivot platform from the second inner pivot, and the outer pivot may be across the pivot platform from the second outer pivot. In an embodiment, the inner pivots and the outer pivots include silicon. In an embodiment, each electrostatic transfer head comprises a mesa structure including a top surface having a surface area in a range of 1 to 10,000 square micrometers.

In an embodiment, the micro device transfer system includes the micro pick up array having an electrode and a substrate electrostatic voltage source contact on the substrate. The substrate electrostatic voltage source connection may be in electrical connection with the electrode. In an embodiment, the micro device transfer system includes the micro pick up array mount having a pivot platform electrostatic voltage source contact on the pivot platform and a base electrostatic voltage source contact on the base. The pivot platform electrostatic voltage source contact may be in electrical connection with the base electrostatic voltage source contact. The micro pick up array mount may also include a first trace extending from the pivot platform electrostatic voltage source contact and placing the pivot platform electrostatic voltage source contact in electrical connection with the base electrostatic voltage source contact. Furthermore, the micro pick up array may also include a second trace extending from the substrate electrostatic voltage source contact and placing the substrate electrostatic voltage source contact in electrical connection with the electrode through the second trace. The substrate electrostatic voltage source contact may align with the pivot platform electrostatic voltage source contact to place the electrode in electrical connection with the base electrostatic voltage source contact.

In an embodiment, the micro device transfer system may include a base clamp contact on the base and in electrical connection with a clamp electrode on the pivot platform. The micro device transfer system may also include a trace extending from the clamp electrode and placing the clamp electrode in electrical connection with the base clamp contact. The clamp electrode may align with the substrate to electrostatically bond the micro pick up array to the pivot platform when voltage is applied to the clamp electrode from the base clamp contact through the trace. In an embodiment, the micro pick up array may attach to the pivot platform by a permanent bond, such as by a thermocompression bond.

In an embodiment, the micro device transfer system includes a heating contact on the base and a heating element over the pivot platform in electrical connection with the heating contact. The micro pick up array mount may also include a temperature sensor on the pivot platform.

A micro device transfer system and methods of using the micro device transfer system to transfer an array of micro devices from a carrier substrate are disclosed. In an embodiment, the micro device transfer system includes a transfer head assembly having a mounting surface. The micro device transfer system may also include a micro pick up array mount having a pivot platform, a base laterally around the pivot platform, and a beam that connects the base with the pivot platform, and a micro pick up array having a substrate supporting an array of electrostatic transfer heads. In an embodiment, the pivot platform may be deflectable toward the transfer head assembly when the base is mounted on the mounting surface and the micro pick up array is mounted on the pivot platform. In an embodiment, the transfer head assembly includes a sensor to detect deflection of the pivot platform toward the transfer head assembly. For example, the sensor may be a contact sensor to sense a deflected position of the pivot platform and the contact sensor can include a switch. Alternatively, the sensor may be a motion sensor to sense movement of the pivot platform.

In an embodiment, the micro device transfer system may include the transfer head assembly having an electrostatic voltage source connection, the micro pick up array mount having a pivot platform electrostatic voltage source contact and a base electrostatic voltage source contact, and the micro pick up array having a substrate electrostatic voltage source contact. The electrostatic voltage source connection may be aligned with the base electrostatic voltage source contact and the pivot platform electrostatic voltage source contact may be aligned with the substrate electrostatic voltage source contact.

In an embodiment, the micro device transfer system includes the transfer head assembly having a vacuum port coupled with a vacuum source to apply suction to the micro pick up array mount. In an embodiment, the transfer head assembly may have a clamping voltage source connection. The micro pick up array mount may have a clamp electrode on the pivot platform to apply an electrostatic force to the micro pick up array. In an embodiment, the micro pick up array mount may have a base clamp contact on the base in electrical connection with the clamp electrode. The micro pick up array mount may also have a trace extending from the clamp electrode and placing the clamp electrode in electrical connection with the base clamp contact. The clamp voltage source connection may be aligned with the base clamp contact and the substrate may be aligned with the clamp electrode to electrostatically bond the micro pick up array to the pivot platform when voltage is applied to the clamp electrode from the clamping voltage source connection through the base clamp.

In an embodiment, the micro device transfer system includes the transfer head assembly having a holding electrode coupled to an electrostatic voltage source to apply an electrostatic force to the micro pick up array mount and a clamping voltage source connection. Furthermore, the micro device transfer system may include the micro pick up array mount having a clamp electrode on the pivot platform to apply and electrostatic force to the micro pick up array. The micro pick up array mount may have a base clamp contact on the base in electrical connection with a clamp electrode on the pivot platform. The micro pick up array mount may have a trace extending from the clamp electrode to place the clamp electrode in electrical connection with the base clamp contact. The clamp voltage source connection may be aligned with the base clamp contact and the substrate may be aligned with the clamp electrode to electrostatically bond the micro pick up array to the pivot platform when voltage is applied to the clamp electrode from the clamping voltage source connection through the base clamp.

In an embodiment, each electrostatic transfer head includes a mesa structure having a top surface with a surface area in a range of 1 to 10,000 square micrometers. In an embodiment, the micro pick up array is attached to the pivot platform by a permanent bond that includes a thermocompression bond.

In an embodiment, the micro device transfer system includes the transfer head assembly having a heating connection and the micro pick up array mount having a heating contact on the base and a heating element over the pivot platform in electrical connection with the heating contact.

In an embodiment, a method includes moving a transfer head assembly toward a carrier substrate and contacting an array of micro devices on the carrier substrate with a micro pick up array having an array of electrostatic transfer heads. The micro pick up array may be mounted on a micro pick up array mount and the micro pick up array mount may be mounted on the transfer head assembly. The method may further include deflecting a pivot platform of the micro pick up array mount toward the transfer head assembly, sensing deflection of the pivot platform, stopping relative movement between the transfer head assembly and the carrier substrate, applying a voltage to the array of electrostatic transfer heads to create a grip pressure on the array of micro devices, and picking up the array of micro devices from the carrier substrate. In an embodiment, the method includes moving the transfer head assembly toward the pivot platform after sensing deflection and before stopping relative movement. In an embodiment, the method includes stopping relative movement between the transfer head assembly and the carrier substrate may occur after sensing deflection of the pivot platform with a plurality of sensors. In an embodiment, the method includes moving the transfer head assembly toward the carrier substrate for a set distance after sensing deflection of the pivot platform. In an embodiment, the method includes stopping relative movement between the transfer head assembly and the carrier substrate immediately in response to sensing deflection of the pivot platform. In an embodiment, the method includes actuating the transfer head assembly to further align the pivot platform to a plane of the carrier substrate by tipping or tilting the transfer head assembly after sensing deflection of the pivot platform. In an embodiment, the method includes applying heat to the array of electrostatic transfer heads while picking up the array of micro devices.

In an embodiment, a method includes moving a transfer head assembly toward a receiving substrate and contacting the receiving substrate with an array of micro devices carried by a micro pick up array. The micro pick up array may have an array of electrostatic transfer heads and be mounted on a micro pick up array mount that is mounted on the transfer head assembly. The method may also include deflecting a pivot platform of the micro pick up array mount toward the transfer head assembly, sensing deflection of the pivot platform, stopping relative motion between the transfer head assembly and the receiving substrate, removing a voltage from the array of electrostatic transfer heads, and releasing the array of micro devices onto the receiving substrate. In an embodiment, the method includes moving the transfer head assembly toward the pivot platform after sensing deflection and before stopping relative movement. In an embodiment, the method includes stopping relative movement between the transfer head assembly and the receiving substrate after sensing deflection of the pivot platform with a plurality of sensors. In an embodiment, the method includes moving the transfer head assembly toward the receiving substrate for a set distance after sensing deflection of the pivot platform. In an embodiment, the method includes stopping relative movement between the transfer head assembly and the receiving substrate immediately in response to sensing deflection of the pivot platform. In an embodiment, the method includes stopping relative movement between the transfer head assembly and the receiving substrate immediately in response to sensing deflection of the pivot platform. In an embodiment, the method includes actuating the transfer head assembly to further align the pivot platform to a plane of the receiving substrate by tipping or tilting the transfer head assembly after sensing deflection of the pivot platform. In an embodiment, the method includes applying heat to the array of micro devices before removing the voltage from the array of electrostatic transfer heads.

DETAILED DESCRIPTION

Figure 1:
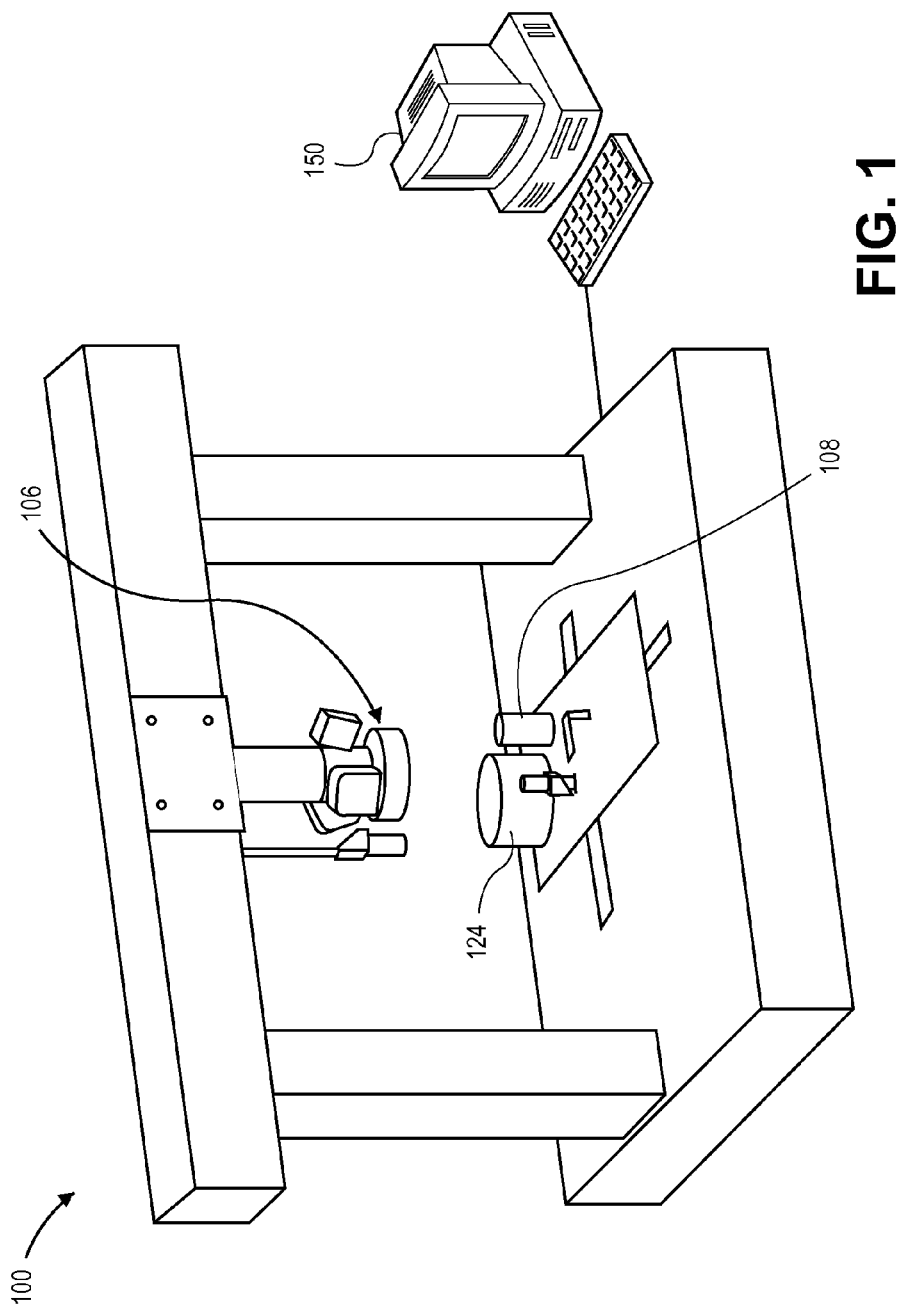
FIG. 1 is a perspective view illustration of a mass transfer tool in accordance with an embodiment of the invention.

Embodiments of the present invention describe systems and methods for transferring a micro device or an array of micro devices from a carrier substrate. For example, the micro devices or array of micro devices may be any of the micro LED device structures illustrated and described in related U.S. patent application Ser. Nos. 13/372,222, 13/436,260, 13/458,932, and 13/625,825. While some embodiments of the present invention are described with specific regard to micro LED devices, the embodiments of the invention are not so limited and certain embodiments may also be applicable to other micro LED devices and micro devices such as diodes, transistors, ICs, and MEMS.

In various embodiments, description is made with reference to the figures. However, certain embodiments may be practiced without one or more of these specific details, or in combination with other known methods and configurations.

In the following description, numerous specific details are set forth, such as specific configurations, dimensions, and processes, in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 µm. However, embodiments of the present invention are not necessarily so limited, and certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, the top contact surface of each micro device or electrostatic transfer head has a maximum dimension of 1 to 100 µm. In an embodiment, the top contact surface of each micro device or electrostatic transfer head has a maximum dimension of 3 to 20 µm. In an embodiment, a pitch of an array of micro devices, and a pitch of a corresponding array of electrostatic transfer heads is (1 to 100 µm) by (1 to 100 µm), for example a 20 µm by 20 µm, or 5 µm by 5 µm pitch. In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip pressure on a micro device and pick up the micro device.

In one aspect, embodiments of the invention describe systems and methods for the mass transfer of micro devices using a micro pick up array mount with a self-aligning capability. In an embodiment, the micro pick up array mount may include one or more pivots and beams to allow a mounted micro pick up array to automatically align to a carrier substrate or a receiving substrate when the system components are brought into contact, e.g., when electrostatic transfer heads supported by the micro pick up array contact an array of micro devices on the carrier substrate. Thus, the micro pick up array mount facilitates more complete and uniform contact between the array of electrostatic transfer heads and array of micro devices being transferred. In this manner, the self-aligning capability of the micro pick up array mount may allow for a simpler mass transfer tool design in which an expensive arrangement of sensors (such as spectral-interference laser displacement meters) and actuators may not be required for fine-alignment of the micro pick up array with the carrier or receiving substrate on the micron or sub-micron scale prior to picking up or releasing the array of micro devices. Thus, the self-aligning capability may reduce cost of system components, while also increasing the transfer rate of micro devices since fine-alignment may be accomplished by the self-aligning capability while picking up and releasing the array of micro devices.

In another aspect, embodiments of the invention describe systems and methods for the mass transfer of micro devices using sensors to sense system component deflections. A variety of sensors may be employed such as expensive spectral-interference laser displacement meters, or less expensive sensor switches that detect contact between system components. For example, a sensor may detect deflection of a micro pick up array mount when a mounted micro pick up array contacts a micro device on a carrier substrate, or when a micro device carried by the micro pick up array contacts a receiving substrate. More specifically, in an embodiment, relative movement between a transfer head assembly and a carrier substrate, or relative movement between the transfer head assembly and a receiving substrate, may be stopped in response to a sensed deflection. Movement may stop immediately upon detection, or upon a predetermined event following detection. Thus, contact between an array of micro devices and an array of electrostatic transfer heads or a receiving substrate may be monitored to control pick up and release of the array of micro devices.

In yet another aspect, embodiments of the invention describe systems and methods for the mass transfer of micro devices using system components having electrostatic voltage source connections and contacts that align to place the system components in electrical connection with each other. In an embodiment, an electrostatic voltage source connection of a transfer head assembly may be placed in electrical connection with an array of electrostatic transfer heads. More specifically, a voltage may be supplied from an electrostatic voltage source connection to the array of electrostatic transfer heads through various contacts and connectors, e.g., vias and traces, which align to create an operating voltage path traversing several components. An operating voltage applied to, e.g., an electrode of the electrostatic transfer head from the electrostatic voltage source connection, may allow the electrostatic transfer head to apply a grip pressure to a micro device.

In still another aspect, embodiments of the invention describes systems and methods for the mass transfer of micro devices using system components having clamping voltage source connections and contacts that align to join the system components with each other. In an embodiment, a clamping voltage source connection of a transfer head assembly may be placed in electrical connection with a clamp electrode of a micro pick up array mount. More specifically, a voltage may be supplied from a clamping voltage source connection to the micro pick up array through various contacts and connectors, e.g., vias and traces, which align to create a clamping voltage path traversing several components. A clamping voltage applied to the clamp electrode on the micro pick up array mount from the clamping voltage source connection may electrostatically hold a micro pickup array against the micro pick up array mount.

In another aspect, embodiments of the invention describe systems and methods for the mass transfer of micro devices using system components having heating mechanisms to apply heat to an array of micro devices. In an embodiment, the heating mechanism includes a resistive heating element on a micro pick up array mount. Heat may thus be delivered through the micro pick up array mount to one or more electrostatic transfer heads on a micro pick up array mounted on the micro pick up array mount, and into an array of micro devices gripped by the electrostatic transfer heads. In this manner, it is possible to transfer heat from a micro pick up array mount having a self-aligning capability to a micro device carried by the micro pick up array mount without excessively heating portions of the micro pick up array mount.

In yet another aspect, embodiments of the invention describe a manner for mass transfer of an array of pre-fabricated micro devices with an array of electrostatic transfer heads. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 20 µm by 20 µm pitch, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A transfer tool including an array of electrostatic transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of electrostatic transfer heads can pick up and transfer more than 100,000 micro devices, with larger arrays of electrostatic transfer heads being capable of transferring more micro devices.

FIG. 1 is a perspective view illustration of a mass transfer tool for transferring micro devices from a carrier substrate shown in accordance with an embodiment of the invention. Mass transfer tool 100 includes a transfer head assembly 206 for picking up a micro device from a carrier substrate held by a carrier substrate holder 108 and for transferring and releasing the micro device onto a receiving substrate held by a receiving substrate holder 124. A system of actuators operates to move the transfer head assembly 206 under the control of a computer system 150. Furthermore, computer system 150 controls the actuators based on feedback inputs from various sensors. In some embodiments, mass transfer tool 100 may be any of the mass transfer tool embodiments illustrated and described in related U.S. patent application Ser. No. 13/607, 031, which is hereby incorporated by reference.

Figure 2:
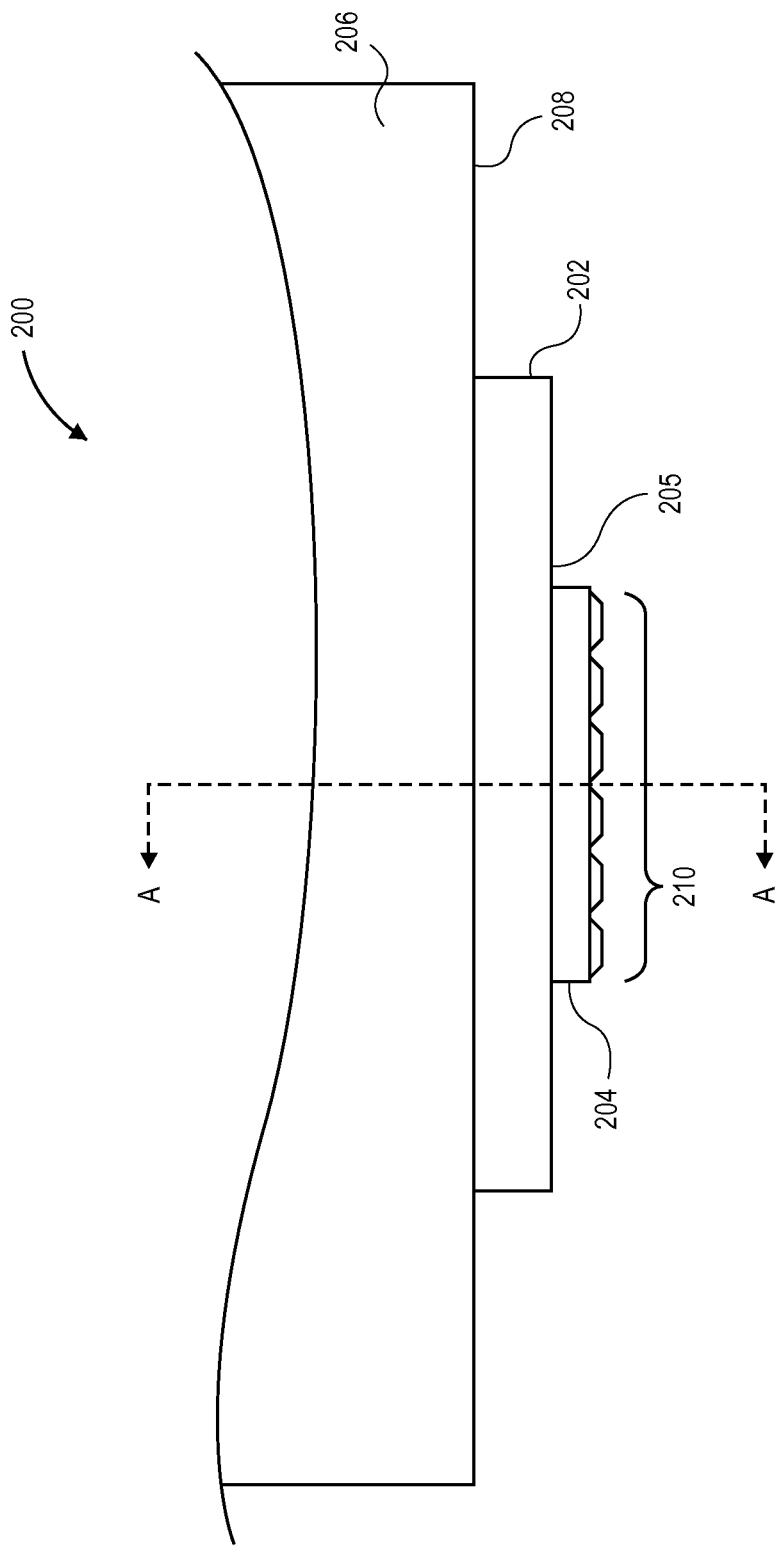
FIG. 2 is a side view illustration of a micro device transfer system including a transfer head assembly holding a micro pick up array mount with a micro pick up array mounted on the micro pick up array mount in accordance with an embodiment of the invention.

Referring to FIG. 2, a side view illustration of a micro device transfer system including a transfer head assembly holding a micro pick up array mount with a micro pick up array mounted on the micro pick up array mount is shown in accordance with an embodiment of the invention. Micro device transfer system 200 includes micro pick up array mount 202, micro pick up array 204, and transfer head assembly 206. Each of these system components may be joined. For example, micro pick up array mount 202 may be retained on a mounting surface 208 of transfer head assembly 206, and micro pick up array 204 may be retained on a mounting surface 205 of the micro pick up array mount 202. In an embodiment, the components of micro pick up array system 200 may be electrically connected, such that an operating voltage path or clamping voltage path traverses multiple components. These aspects are described further below.

Figure 3A:
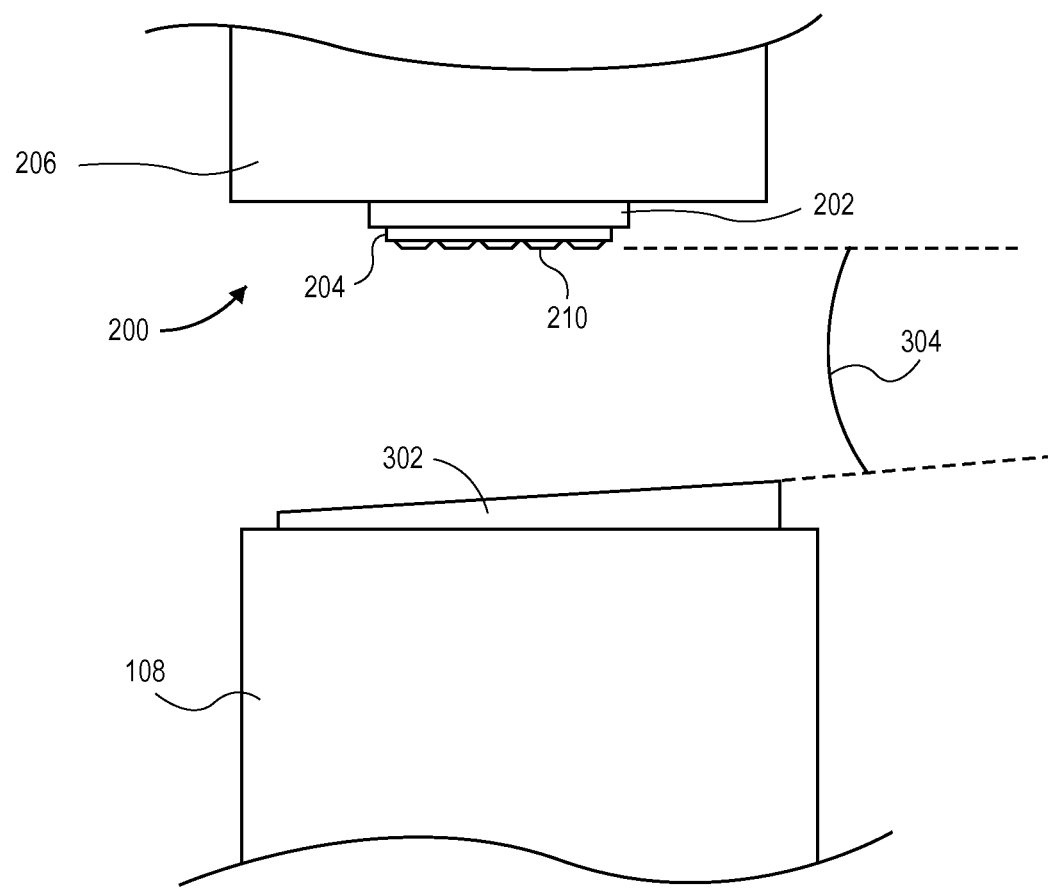
FIG. 3A is a side view illustration of a micro device transfer system having an array of electrostatic transfer heads positioned over and apart from an array of micro devices on a carrier substrate in accordance with an embodiment of the invention.

Referring to FIG. 3A, a side view illustration of a micro device transfer system having an array of electrostatic transfer heads positioned over and apart from an array of micro devices on a carrier substrate is shown in accordance with an embodiment of the invention. Micro device transfer system 200 with micro pick up array 204 supporting array of electrostatic transfer heads 210 may be positioned over and apart from an array of micro devices (not shown) carried on carrier substrate 302, which is held by carrier substrate holder 108. In an initial state, micro pick up array 204 and carrier substrate 302 may have surfaces that are misaligned by an angle 304. Furthermore, micro pick up array 204 is mounted on micro pick up array mount 202. Micro pick up array mount 202 includes a pivot platform as described in more detail in the following description that allows for the self-alignment of micro pick up array 204 with the array of micro devices on the carrier substrate 302. Thus, micro pick up array 204 is able to move relative to transfer head assembly 206.

Figure 3B:
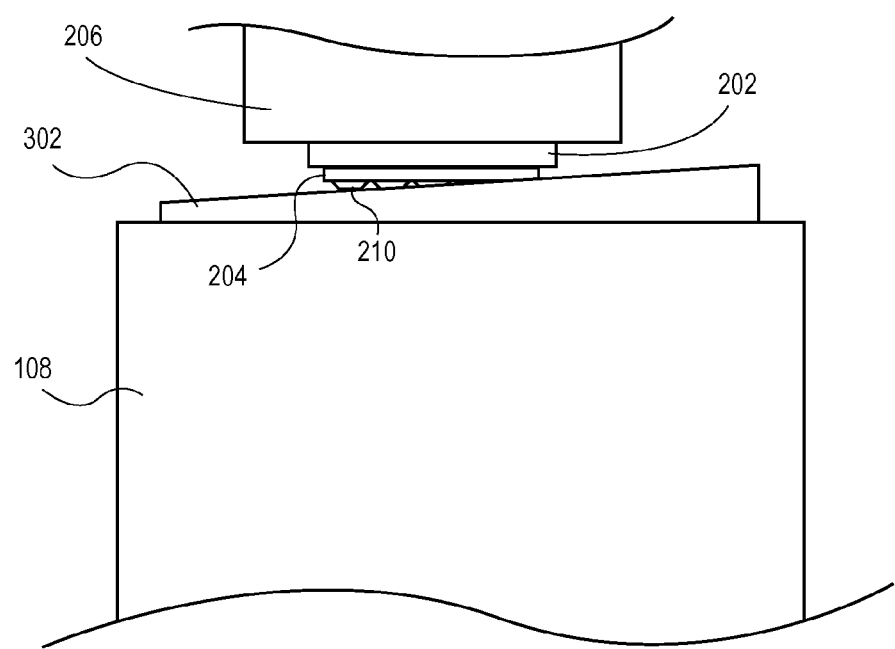
FIG. 3B is a side view illustration of a micro device transfer system having an array of electrostatic transfer heads positioned over and in contact with an array of micro devices on a carrier substrate in accordance with an embodiment of the invention.

Referring to FIG. 3B, a side view illustration of a micro device transfer system having an array of electrostatic transfer heads positioned over and in contact with an array of micro devices on a carrier substrate is shown in accordance with an embodiment of the invention. When micro pick up array 204 is moved toward carrier substrate 302 from the misaligned state shown in FIG. 3A, the array of electrostatic transfer heads 210 may contact an array of micro devices on the carrier substrate 302 unevenly. For example, one side of array of electrostatic transfer heads 210 may contact the array of micro devices while another side may not. Alternatively, all of the electrostatic transfer heads 210 may make contact, but the pressure applied throughout the array of electrostatic transfer heads may be uneven. However, as described below, the forces imparted to array of electrostatic transfer heads 210 may tip and tilt the pivot platform, allowing array of electrostatic transfer heads 210 to align with the array of micro devices on carrier substrate 302. That is, the pivot platform may rotate and translate about and along multiple axes to align with the contacting surface, e.g., carrier substrate 302, such that complete and uniform contact is achieved.

Since the pivot platform self-aligns, pressure and/or contact distribution throughout micro pick up array 204 may be substantially uniform. Uniform pressure distribution can include even pressure and/or contact between the electrostatic transfer heads 210 and the micro devices on carrier substrate 302. Such uniform pressure or contact may avoid damage to electrostatic transfer heads 210 or micro devices and it may enable the contact and transfer of all, or nearly all, of the micro devices.

Figure 4A:
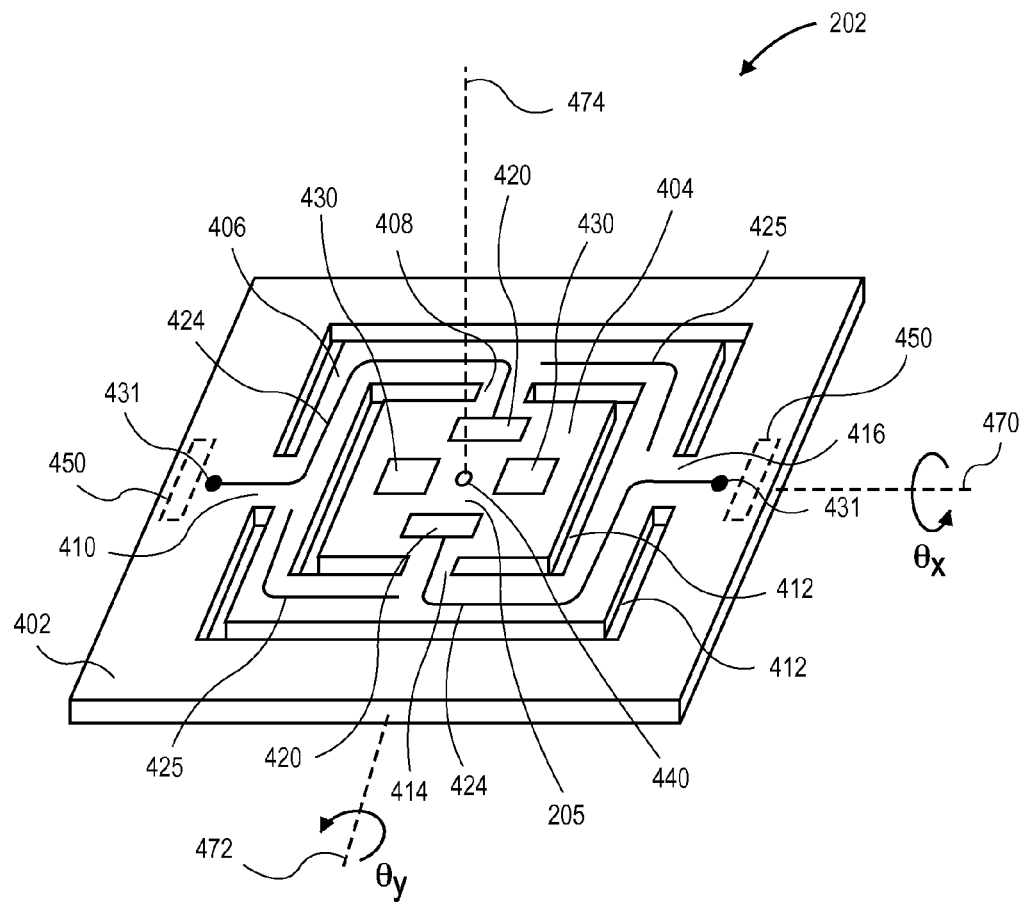
FIG. 4A is a perspective view illustration of a micro pick up array mount having an electrostatic bonding site in accordance with an embodiment of the invention.

Referring now to FIG. 4A, a perspective view illustration is shown of a micro pick up array mount having an electrostatic bonding site in accordance with an embodiment of the invention. Micro pick up array mount 202 may be joined with, and placed between, micro pick up array 204 and transfer head assembly 206, allowing relative movement between those components. Relative movement of 204/206 may result in automatic alignment of the array of electrostatic transfer heads 210 with an array of micro devices on a carrier substrate. As a result, the electrostatic transfer heads 210 may contact every corresponding micro device of the array of micro devices with uniform pressure.

In the embodiment illustrated, micro pick up array mount 202 includes base 402 and pivot platform 404. In an embodiment, base 402 surrounds all or a part of pivot platform 404. For example, base 402 may extend laterally around pivot platform 404, as illustrated. In an alternative embodiment, base 402 does not surround pivot platform 404. Base 402 and pivot platform 404 may be interconnected by one or more beams 406. Each beam 406 may connect with base 402 and pivot platform 404 at one or more pivot locations, such as inner pivot 408, 414 and outer pivot 410, 416.

FIG. 4A shows both base 402 and pivot platform 404 having rectangular perimeters, however base 402 and pivot platform 404 may be shaped differently. For example, base 402 may be circular, hexagonal, oval, etc., without departing from the scope of this disclosure. Likewise, pivot platform 404 may be alternatively shaped. For example, pivot platform 404 may be circular, hexagonal, oval, etc. In an embodiment, base 402 and pivot platform 404 have conforming shapes, such that pivot platform 404 is nestled within the base 402 of the same shape. In other embodiments, base 402 and pivot platform 404 do not have conforming shapes. For example, base 402 may be circular and pivot platform 404 may be rectangular, resulting in additional gaps near the midpoint of each side of pivot platform 404. Such mismatch may allow for beams 406 to be extended within the gap areas in order to provide larger bending arms, in accordance with the following disclosure.

Still referring to FIG. 4A, beam 406 may extend from inner pivot 408 to outer pivot 410 laterally around pivot platform 404. More particularly, beam 406 may conform to base 402 and pivot platform 404 by fitting between those components and substantially filling a void between those components. In at least one embodiment, the lateral extension of beam 406 provides a lever arm that allows adequate bending in beam 406 and torsion in pivots 408 and 410 to enable relative movement between base 402 and pivot platform 404 when forces are applied to those components. Bending in beam 406 includes a component orthogonal to base 402, e.g., a z-direction component along axis 474.

In an embodiment, the pivots of micro pick up array mount 202 are positioned to twist about multiple axes. For example, inner pivot 408 is positioned on pivot platform 404 at an edge that is orthogonal to an edge of base 402 on which outer pivot 410 is positioned. Thus, axes such as axis 470 and axis 472 running perpendicular to the edges that inner pivot 408 and outer pivot 410 are positioned on, are also orthogonal to each other. Resultantly, pivot platform 404 and base 402 may twist relative to each other along axes 470 and 472. For example, pivot platform 404 can twist in a direction $\theta_x$ about axis 470, relative to base 402. Additionally, pivot platform 404 can twist in a direction $\theta_y$ about axis 472, relative to base 402.

Micro pick up array mount 202 may include pairs of pivots along an axis of torsion. For example, micro pick up array mount 202 may include inner pivot 414 positioned across pivot platform 404 from inner pivot 408. Thus, pivot platform 404 may be supported along opposite sides by beam 406 at inner pivots 408 and 414. Furthermore, pivot platform 404 may rotate about an axis, e.g., axis 472 running through inner pivot 408 and inner pivot 414 when a force is applied to the pivot platform offset from the axis. For example, pivot platform 404 may rotate in a direction $\theta_y$ about axis 472 when a force is applied to beam 406 near outer pivot 410. Likewise, micro pick up array mount 202 may include outer pivot 416 positioned across pivot platform 404 from outer pivot 410. Thus, the beam 406 connecting pivot platform 404 with base 402 may be supported along opposite sides by base 402 at outer pivots 410 and 416. Furthermore, pivot platform 404 may rotate about an axis, e.g., axis 470, running through outer pivot 410 and outer pivot 416 when a force is applied to the pivot platform offset from the axis. For example, pivot platform 404 may rotate in a direction $\theta_x$ about axis 470 when a force is applied to beam 406 near inner pivot 408. Thus, pivots of micro pick up array mount 404 facilitate movement and automatic alignment between the base 402 and pivot platform 404. The kinematics of micro pick up array mount 202 will be described further below.

In accordance with embodiments of the invention, micro pick up array mount 202 may be formed from one or more portions or parts. Several materials may be utilized for the micro pick up array mount 202. Material selection for the micro pick up array mount is driven by the capability to deflect under applied load, thermal stability, and minimal spring mass. Table 1 lists relevant material properties for several candidate materials including silicon, silicon carbide, aluminum nitride, stainless steel, and aluminum.

TABLE 1

| Material | Modulus (GPA) | Yield Strength (MPa) | Flexure Ratio (×10e-3) | CTE (ppm/° C.) | Density (kg/m$^3$) |
| --- | --- | --- | --- | --- | --- |
| Silicon | 165 | 2000 | 12.1 | 2.6 | 2400 |
| Silicon Carbide | 410 | 550 | 1.3 | 4.0 | 3100 |
| Aluminum Nitride | 320 | 320 | 1.0 | 4.5 | 3260 |
| Stainless Steel 316 | 190 | 600 | 3.2 | 14 | 8240 |
| Aluminum | 70 | 47 | 0.7 | 23 | 2700 |

Although each of the listed materials may be used for the micro pick up array mount, silicon has the largest flexure ratio, lowest CTE, and lowest density of the candidate materials. In addition, silicon may be formed with a variety of precision semiconductor manufacturing techniques.

Thus, in an embodiment, base 402, pivot platform 404, and beam 406 are formed from a silicon wafer to produce distinct regions. More specifically, known processes, such as deep etching, laser cutting, etc. may be used to form channels 412. In at least one embodiment, channels 412 may therefore define the structure of micro pick up array mount 202 by providing separations between, e.g., base 402 and pivot platform 404 regions.

Figure 4B:
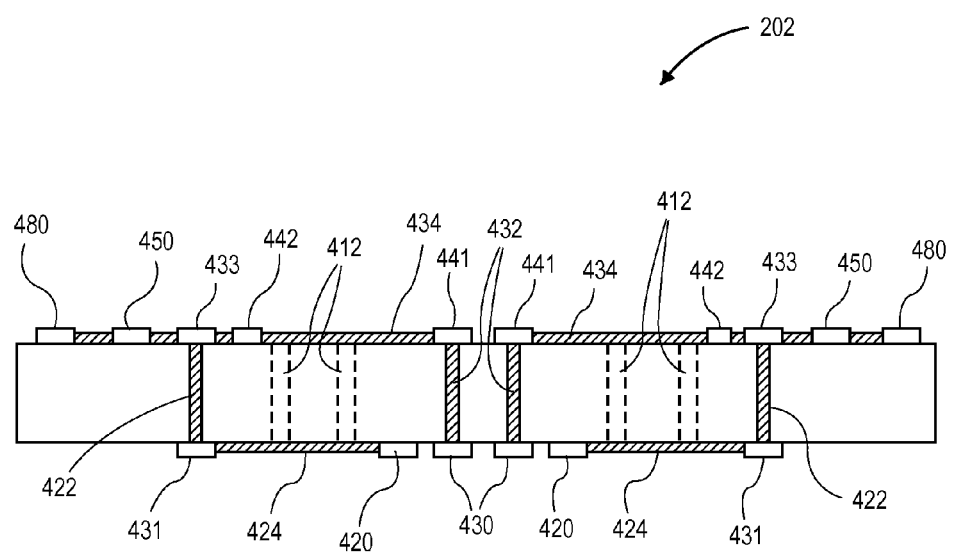
FIG. 4B is a side view illustration of a micro pick up array mount having an electrostatic bonding site in accordance with an embodiment of the invention.

Referring to FIGS. 4A-4B, micro pick up array mount 202 may include one or more pivot platform electrostatic voltage source contacts 420 on pivot platform 404. Electrostatic voltage source contacts 420 may function to transfer the operating voltage to the array of electrostatic transfer heads on the micro pick up array 204 when operably connected with the micro pick up array mount 202. In an embodiment, electrostatic voltage source contact(s) 420 are formed using a suitable technique such as, but not limited to, sputtering or electron beam evaporation of a conductive material (e.g., metal) onto a surface of pivot platform 404. Referring now to FIG. 4B, pivot platform each electrostatic voltage source contact 420 may further be placed in electrical connection with a landing pad 431 of a via structure 422, which extends through the micro pick up array mount 202 to base electrostatic voltage source contact 433. Furthermore, and more particularly, pivot platform electrostatic voltage source contact 420 may be placed in electrical connection with via 422 through trace 424. Trace 424 connects pivot platform electrostatic voltage source contact 420 to landing pad 431. As shown, trace 424 may run over one or more of the portions on the micro pick up array mounting side of micro pick up array mount 202. For example, trace 424 may run over base 402, beam 406, and pivot platform 404. Trace 424 may also be formed using a suitable technique such as sputtering or e-beam evaporation. In an embodiment, electrostatic voltage source contacts 420, landing pads 431, and traces 424 are simultaneously formed. In an embodiment, trace 424 may be a wire that is separate from, or bonded to a surface of, micro pick up array mount 202, and which electrically connects pivot platform electrostatic voltage source contact 420 with landing pad 431.

Micro pick up array mount 202 may further include an arrangement of dummy traces 425 on the same side of the micro pick up array mount 202 as traces 424. As illustrated in FIG. 4A, dummy traces 425 may mirror the arrangement of traces 424 on portions of the beams 406 or pivot platform 404 in order to balance residual and thermal stresses in micro pick up array mount 202. More specifically, residual stresses from the fabrication of micro pick up array mount 202 depend in part on the composite structural characteristics of beams 406. Traces 424 along beams 406 contribute to these characteristics, and residual stresses caused by, e.g., the cooling of beams 406 during fabrication, may therefore be different in beams 406 having traces 424 than beams 406 without traces 424. This difference may result in, e.g., skewing of the self-aligning structure at ambient conditions. Alternatively, or in conjunction with these residual stresses, when heat is applied to micro pick up array mount 202, beams 406 with traces 424 may behave differently, e.g., expand at a different rate, than beams 406 without traces 424. Again, this may distort the micro pick up array structure. Dummy traces 425 give beams 406 without traces 424 similar composite structural characteristics as beams 406 with traces 424. Thus, dummy traces 425 can balance or offset residual and thermal stresses throughout all of the beams 406 to avoid distortion of micro pick up array mount 202.

Micro pick up array mount 202 may include one or more bonding sites to mount the micro pick up array 204 on the micro pick up array mount 202. In an embodiment, a bonding site includes one or more clamping electrodes 430 located on a micro pick up array mounting surface 205 of pivot platform 404. More particularly, the clamping electrodes 430 may be located on the same surface of pivot platform 404 on which pivot platform electrostatic voltage source contacts 420 are located. In an embodiment, the clamping electrodes 430 are formed simultaneously with electrostatic voltage source contacts 420, landing pads 431, and traces 424. Clamp electrodes 430 may further be placed in electrical connection with a via structure 432, which extends through the micro pick up array mount 202. In the embodiment illustrated, the via structure 432 extends through the micro pick up array mount 202 to a landing pad 441 on a back surface, which is in electrical connection with a base clamp contact 442 by a trace 434. As shown, trace 434 may run over one or more portions of the backside surface of micro pick up array mount 202 which connects with the transfer head assembly. For example, trace 434 may run over base 402, beam 406, and pivot platform 404. Furthermore, in an embodiment, trace 434 may be a wire that is separate from, or bonded to a surface of, micro pick up array mount 202, and which electrically connects base clamp contact 442 with via 432 and clamp electrode 430.

Electrical components of micro pick up array mount 202 may be formed in numerous manners. For example, vias 422, 432 may be formed by drilling or etching a hole through base 402, passivating the hole with an insulator, and forming a conductive material (e.g., metal) into the passivated hole to form via 422, 432 using a suitable technique such as sputtering, e-beam evaporation, electroplating, or electroless deposition.

In some embodiments, micro pick up array mount 202 may further be constructed to be secured or clamped to the transfer head assembly 206 with electrostatic principles. As shown in the embodiment illustrated in FIGS. 4A-4E and FIG. 8A-10B, one or more clamp areas 450 may be formed on the backside of the micro pick up array mount 202 to align with the clamp electrodes 1010 of the transfer head assembly 206. In accordance with the principles of electrostatic grippers, using the attraction of opposite charges, a dielectric layer may be formed over the clamp electrodes 1010 and/or the clamp areas 450. Clamp areas 450 can be formed by a variety of methods and assume a variety of configurations. In one embodiment, clamp areas 450 are conductive pads, such as a metal or semiconductor film, formed on the back surface of the micro pick up array mount 202. The conductive pads may be electrically isolated from the other active regions of the micro pick up array mount 202. For example, insulating layers may be formed under, over, and around the conductive pads.

Figure 4C:
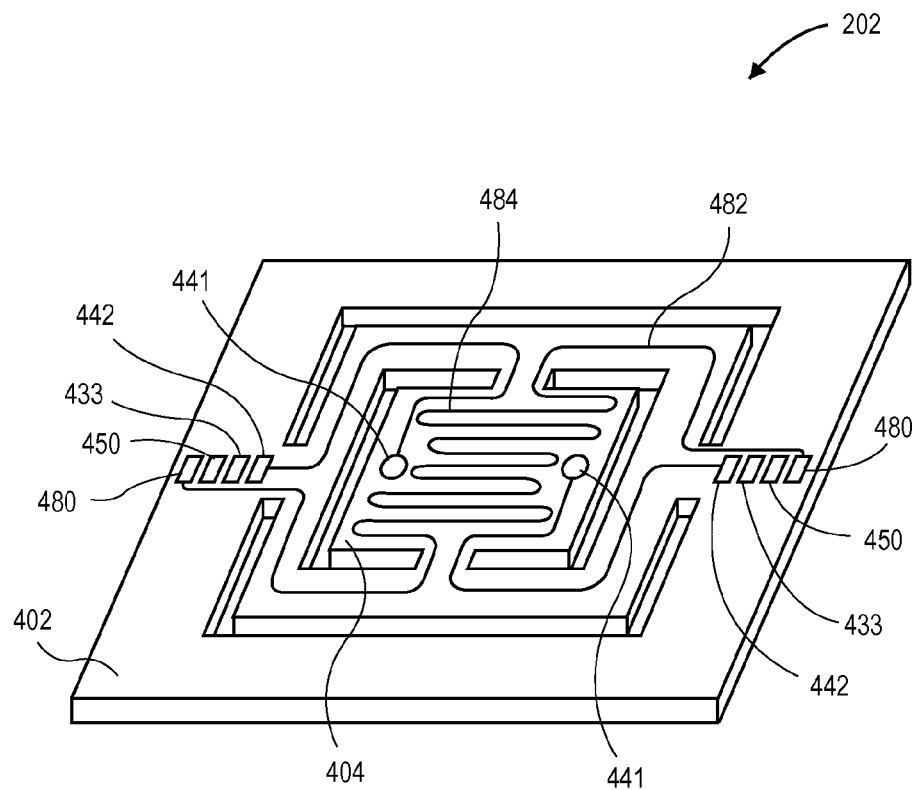
FIG. 4C is a perspective view illustration of a micro pick up array mount having an electrostatic bonding site in accordance with an embodiment of the invention.

Referring to FIG. 4C, a perspective view illustration of a micro pick up array mount having an electrostatic bonding site is shown in accordance with an embodiment of the invention. In some embodiments, micro pick up array mount 202 may include a heating contact 480 placed on base 402. For example, heating contact 480 can be adjacent to clamp area 450 on the bottom surface of micro pick up array mount 202 to align with or otherwise be placed in electrical connection with a heating connection 1090 (FIGS. 10A-10B) of transfer head assembly 206. Multiple heating contacts 480 may be used, for example, to pass current through one or more heating elements 484. More specifically, heating element 484 may extend from a first heating contact 480 and over pivot platform 404 and/or beams 406 before terminating at, e.g., a second heating contact 480. Thus, heating element 484 can carry electrical current between multiple heating contacts 480. As current passes through heating element 484, Joule heating causes the temperature of heating element 484 to rise.

In an embodiment, heating element 484 may be connected with heating contacts 480 by one or more heating leads 482. Heating lead 482 can be sized and configured to dissipate less heat than heating element 484, and thus, act as an electrical lead to carry electrical current from heating contacts 480 over portions of micro pick up array mount 202, e.g., base 402 and beams 406, without heating those portions significantly. For example, heating lead 482 may be a copper conductor. In this manner, heating of micro pick up array mount 202 can be isolated to areas having heating element 484, such as pivot platform 404.

Heating element 484 may be formed from a material and shape that is conducive to resistive heating. More particularly, heating element 484 can be formed to generate heat when an electrical current is passed through it. As an example, heating element 484 can be formed from a wire strand of molybdenum disilicide. The wire strand can be coiled or sinuously placed on the micro pick up array mount 202 to uniformly distribute heat across or throughout a surface or structure, e.g., pivot platform 404. Heating element 484 may be insulated, for example by laminating over the element, to protect adjacent components from excessive heating and to direct heat into pivot platform 404.

In an embodiment, micro pick up array mount 202 includes a temperature sensor to sense the temperature of micro pick up array mount 202 or nearby structures, e.g., a micro pick up array. For example, temperature sensor 440 may be located on the pivot platform to measure the temperature of the pivot platform 404. Temperature sensor 440 may be potted or otherwise adhered or mechanically fixed to the pivot platform. In another embodiment, temperature sensor 440 may be located in a center of pivot platform 404 (FIG. 4A), a corner of pivot platform 404 (FIG. 5A), or on base 402 or beam 406. In still other embodiments, temperature sensor 440 can be located on a front or back surface of pivot platform 404, i.e., on a surface having landing pad 431 or on an opposing surface having landing pad 441. The choice of location can be driven by considerations such as available space and whether the temperature sensor 440 will interfere with other functions, such as whether it will disrupt electrical charge in the electrostatic transfer heads 210. For example, in an embodiment, temperature sensor 440 may be centered on the back surface of pivot platform 404 where the sensor will not mechanically interfere with bonding of the micro pick up array 204. The temperature sensor 440 may be centered on platform 404 to closely approximate the peak temperature of micro pickup array 204. Temperature variations due to convective heat loss may skew the measured temperature if sensor 440 is located in close proximity to the edge of pivot platform 404. Temperature sensor 440 may be any of a variety of known temperature sensors, such as junction-type thermocouples, resistance temperature detectors, etc.

Figure 4D:
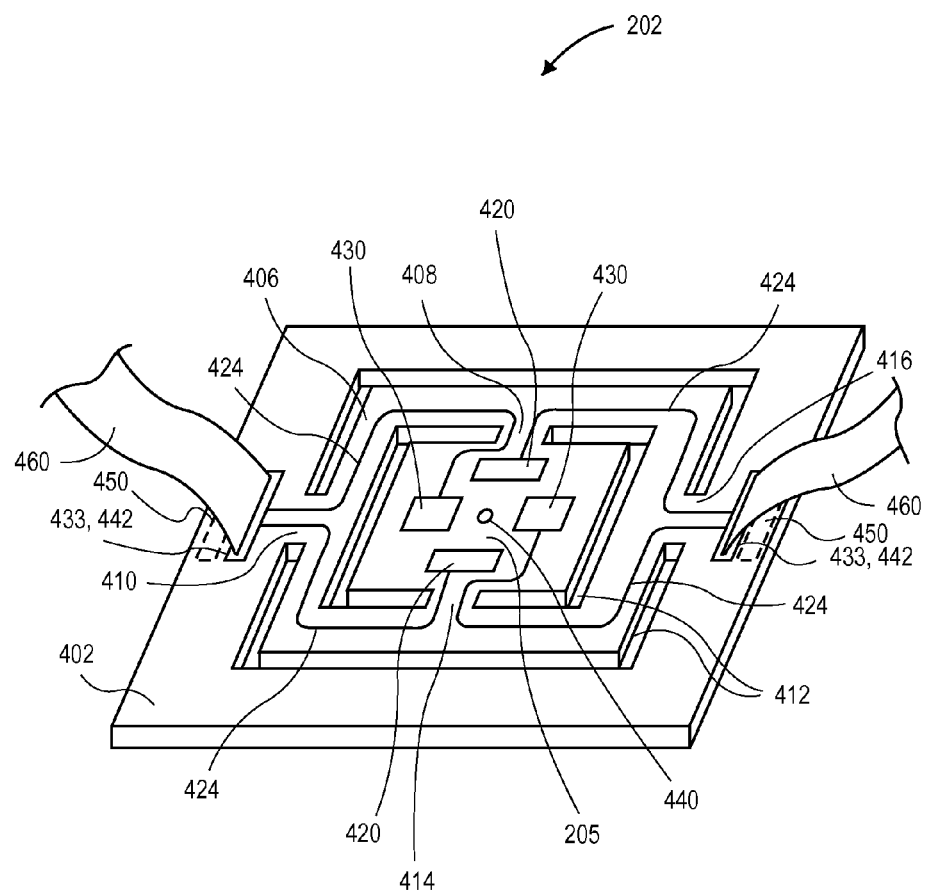
FIG. 4D is a perspective view illustration of a micro pick up array mount having an electrostatic bonding site in accordance with an embodiment of the invention.
Figure 4E:
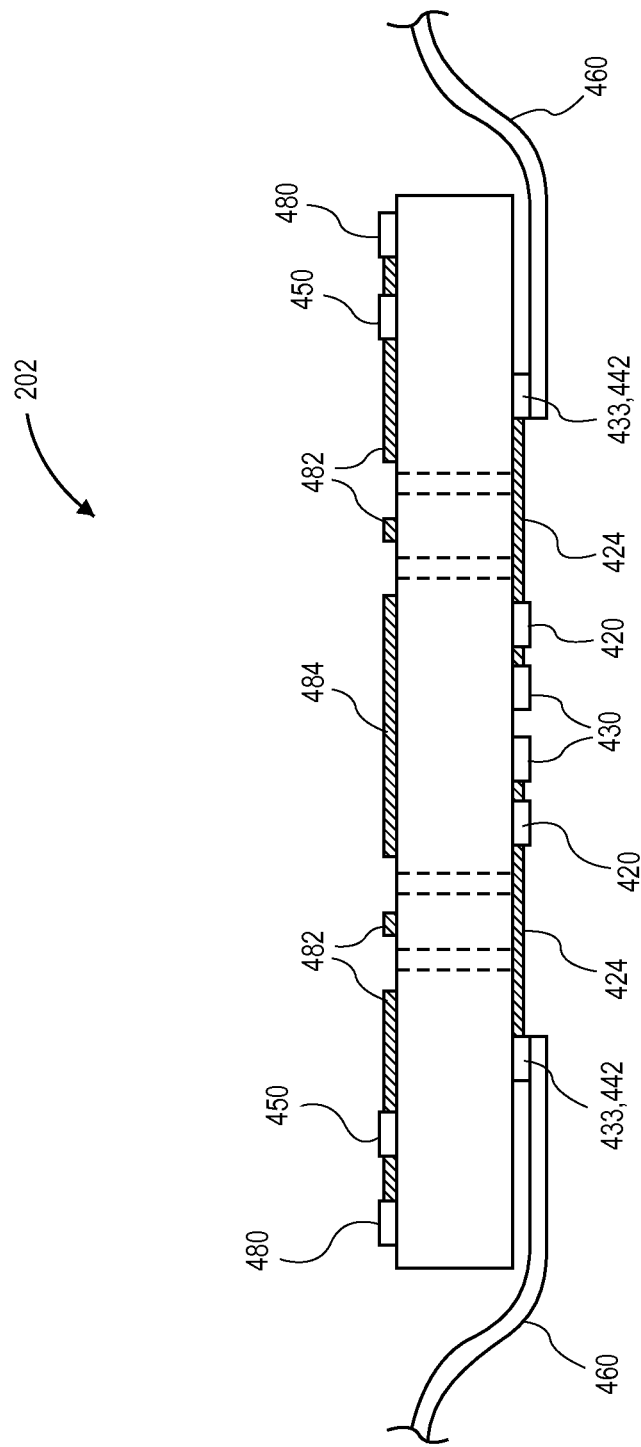
FIG. 4E is a side view illustration of a micro pick up array mount having an electrostatic bonding site in accordance with an embodiment of the invention.

Referring to FIGS. 4D-4E, in an embodiment, micro pick up array mount 202 includes base electrostatic voltage source contact 433 and base clamp contact 442 located on a same surface of micro pick up array mount 202. For example, base electrostatic voltage source contact 433 and base clamp contact 442 can be located on a same side of micro pick up array mount 202 that electrostatic voltage source contacts 420 and clamping electrodes 430 are located. Furthermore, traces 424 can interconnect base electrostatic voltage source contact 433 and base clamp contact 442 with electrostatic voltage source contacts 420 and clamping electrodes 430, respectively. Since the interconnected connections and contacts may be located on a same side of micro pick up array mount 202, there is no need for vias 422, 432. More particularly, traces 424 can run along the same side of micro pick up array mount 202 and over each of beams 406 in a symmetric pattern that balances the weight of traces 424 across beams 406.

In an embodiment, given that base electrostatic voltage source contact 433 and base clamp contact 442 may be located on, e.g., the top surface of base 402, base electrostatic voltage source contact 433 and base clamp contact 442 may be adjacently placed and connected with a separate electrical lead that extends to or from transfer head assembly 206. For example, ribbon cable 460 having wires to make electrical connection between micro pick up array mount 202 and transfer head assembly 206 can be engaged with an insulation-displacement connector in electrical connection with base electrostatic voltage source contact 433 and base clamp contact 442. Therefore, voltage can be applied to base electrostatic voltage source contact 433 and base clamp contact 442 through ribbon cable 460 from an external component, such as the transfer head assembly 206.

Figure 5A:
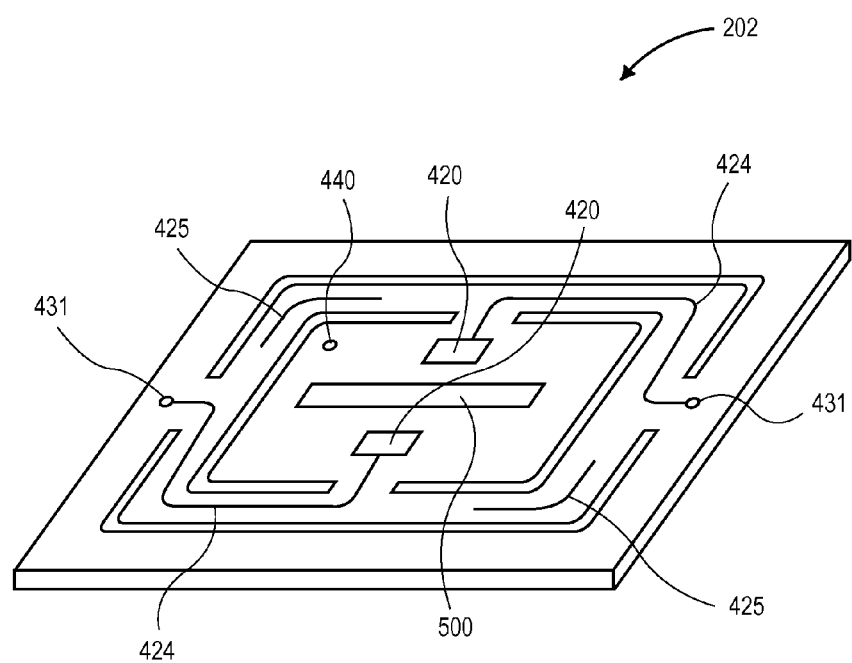
FIG. 5A is a perspective view illustration of a micro pick up array mount having a non-electrostatic bonding site in accordance with an embodiment of the invention.

Referring now to FIG. 5A, a perspective view illustration of a micro pick up array mount having a non-electrostatic bonding site is shown in accordance with an embodiment of the invention. Most components of the micro pick up array mount 202, such as pivot platform electrostatic voltage source contact 420 may be the same or similar to their counterparts in the embodiment of FIG. 4A-4B. However, in this embodiment, the clamping electrodes 430 are replaced with bonding pad 500. Bonding pad 500 may be formed of a variety of materials including polymers, solders, metals, and other adhesives to facilitate the formation of a permanent bond with another structure. In an embodiment, bonding pad 500 may include gold, copper, or aluminum to facilitate the formation of a thermocompression bond with an adjacent structure. For example, a gold-to-gold thermocompression bond may be formed between bonding pad 500 and an adjacent structure. However, a thermocompression bond is only one manner of forming a permanent bond between structures, and thus, bonding pad 500 may include other materials or mechanisms that facilitate the formation of a bond between the micro pick up array mount 202 and another part or structure. For example, direct bonding, adhesive bonding, reactive bonding, soldering, etc., may be used at numerous bonding sites having various shapes and sizes.

Figure 5B:
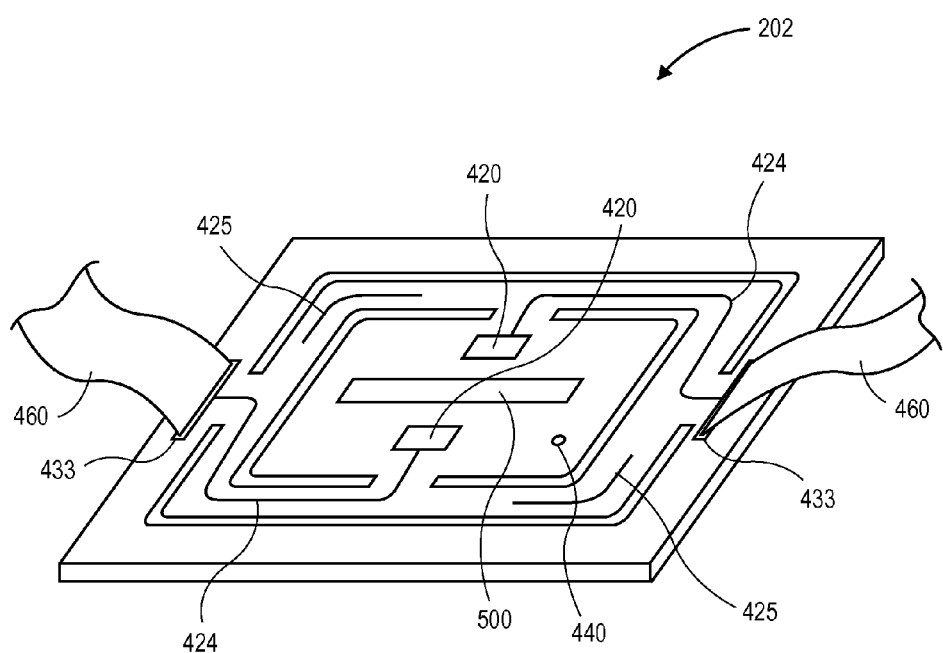
FIG. 5B is a perspective view illustration of a micro pick up array mount having a non-electrostatic bonding site in accordance with an embodiment of the invention.

Referring to FIG. 5B, a perspective view illustration of a micro pick up array mount having a non-electrostatic bonding site is shown in accordance with an embodiment of the invention. In an embodiment, micro pick up array mount 202 can include ribbon cables 460 in electrical communication with base electrostatic voltage source contact 433. As discussed above, ribbon cables 460 can be electrically connected with an external component, such as an electrostatic voltage source of the transfer head assembly, which may eliminate the need for via 422 to deliver voltage to base electrostatic voltage source contact 433.

As shown in FIGS. 4A-4E, micro pick up array mount 202 may include heating element 484 disposed on a pivot platform surface opposite from electrostatic voltage source contacts 420 and clamping electrodes 430. Thus, heat may be delivered through pivot platform 404 to electrostatic voltage source contacts 420 and clamping electrodes 430 or to a micro pick up array in contact with those contacts.

Figure 6A:
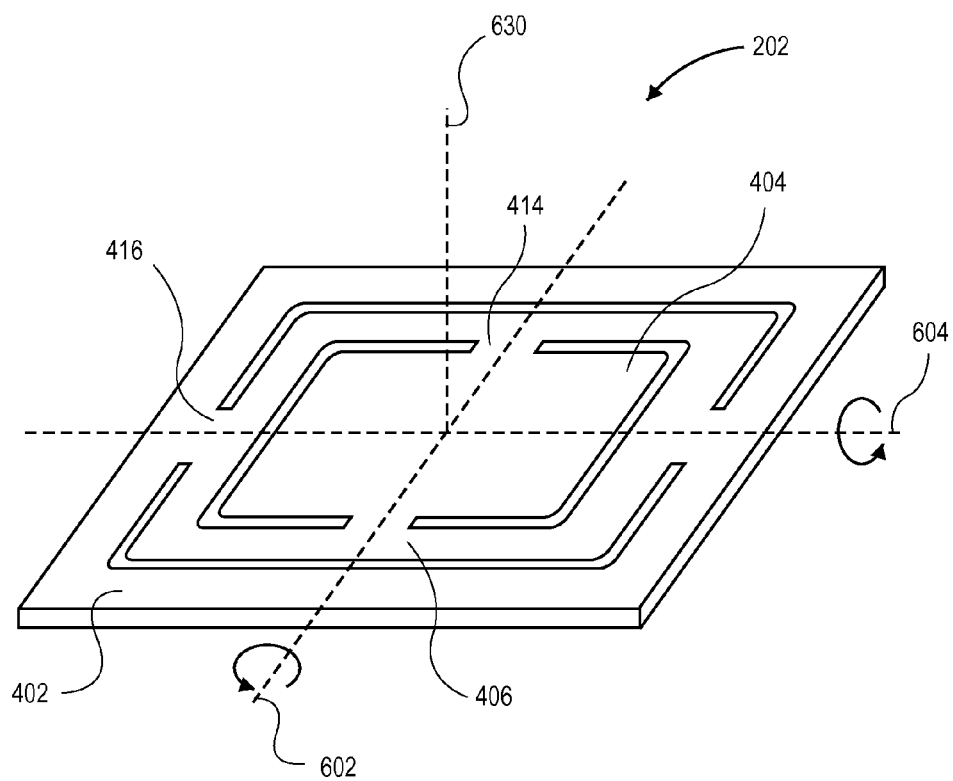
FIG. 6A is a perspective view illustration of a micro pick up array mount having a beam laterally around a pivot platform and an auto-aligning behavior in accordance with an embodiment of the invention.

Referring now to FIG. 6A, a perspective view illustration of a micro pick up array mount having a beam laterally around a pivot platform and an auto-aligning behavior is shown in accordance with an embodiment of the invention. As described above, micro pickup array mount 202 permits movement between platform 404 and base 402 along and about multiple axes as a result of bending of beams 406 and torsion of pivots 408, 410, 414, and 416. Bending of beams 406 can include a z-vector component, such as a component in the direction of axis 630. Furthermore, pivot platform 404 may rotate about a first axis 602 due to twist in inner pivots 408, 414 and about axis 604 due to twist in outer pivots 410, 416. Movement of pivot platform 404 in alternate planes is achieved through bending of beam 406. For example, bending of beam 406 between inner pivot 414 and outer pivots 416 may cause pivot platform 404 to tilt away from the orientation shown in FIG. 6A. Furthermore, bending of beam 406 may allow pivot platform 404 to translate in different directions, such as along axis 630. Thus, pivot platform 404 may self-align to another surface by tipping, tilting, rotating, and translating from its original position relative to base 402.

Translation of pivot platform 404 along axis 630 allows pivot platform 404 to move relative to base 402, when base 402 remains fixed. In other words, movement of pivot platform 404 may result in an expansion, or telescoping, of micro pick up array mount 202 in the direction of axis 630. This expansion may be defined by the deflection, or translation, of pivot platform 404 along axis 630. In an embodiment, the potential amount of deflection relates to the degree of misalignment that may be accommodated between a micro pick up array and a carrier substrate, as will be more fully described below. Thus, in an embodiment, the range of motion of pivot platform 404 along axis 630 relative to base 402 may be in a range of about 1 to 30 micrometers. In another embodiment, the range of motion may be in a range of about 2 to 10 micrometers. Even more particularly, in an embodiment, pivot platform 404 may deflect approximately 10 micrometers away from base 402 along axis 630.

Figure 6B:
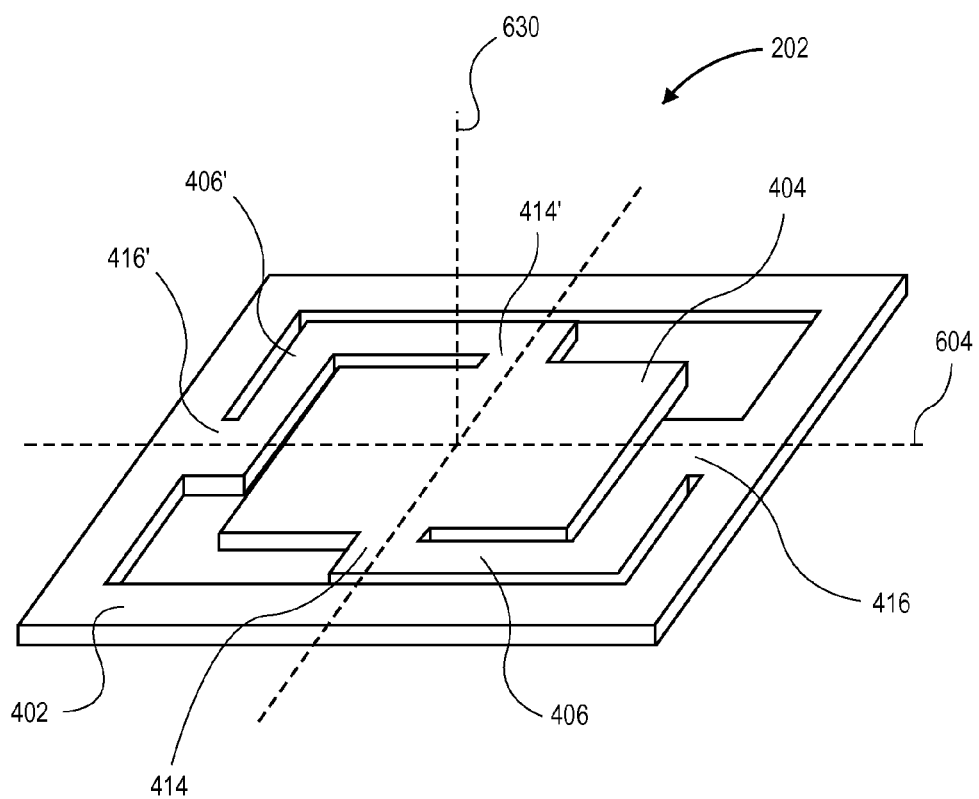
FIG. 6B is a perspective view illustration of a micro pick up array mount having two beams laterally around a portion of a pivot platform and an auto-aligning behavior in accordance with an embodiment of the invention.

Referring now to FIG. 6B, a perspective view illustration of a micro pick up array mount having two beams laterally around a portion of a pivot platform and an auto-aligning behavior is shown in accordance with an embodiment of the invention. Micro pick up array mount 202 includes base 402 structurally connected with pivot platform 404 by beams 406 and 406'. Thus, in an embodiment, the beams 406 may be discontinuous and not completely laterally surround pivot platform 404. More specifically, pivot platform 404 may be supported at one side by beam 406 connected with pivot platform 404 and base 402 at inner pivot 414 and outer pivot 416, respectively. Similarly, pivot platform 404 may be supported at an opposite side by beam 406' connected with pivot platform 404 and base 402 at inner pivot 414' and outer pivot 416'. Alternative structure still allows for pivot platform 404 to tip and tilt relative to base 402. More specifically, pivot platform 404 is able to rotate about axis 602 due to twisting in inner pivots 414, 414', as well as rotate about axis 604 due to twisting in outer pivots 416, 416'. Furthermore, bending in beams 406, 406' allow pivot platform to tilt in various other planes or translate along axes, e.g., 630. Thus, pivot platform 404 may self-align to another surface by tipping and tilting from its original position relative to base 402.

Figure 6C:
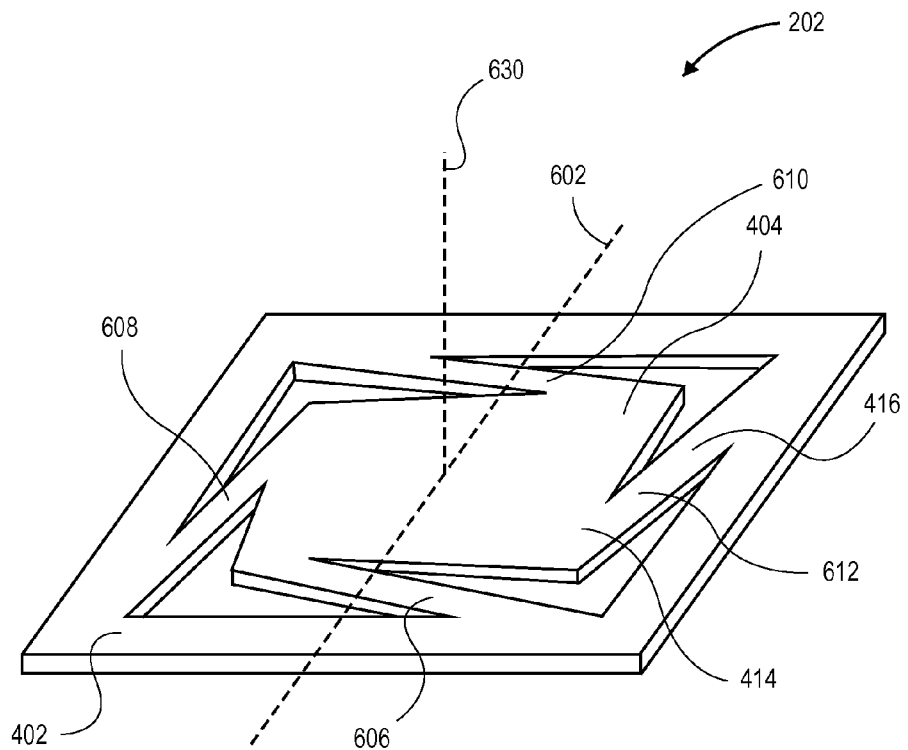
FIG. 6C is a perspective view illustration of a micro pick up array mount having four beams between a pivot platform and a base, and an auto-aligning behavior, in accordance with an embodiment of the invention.

Referring now to FIG. 6C, a perspective view illustration of a micro pick up array mount having four beams between a pivot platform and a base, and an auto-aligning behavior, is shown in accordance with an embodiment of the invention. Micro pick up array mount 202 includes base 402 structurally connected with pivot platform 404 by beams 606, 608, 610, and 612. Thus, in an embodiment, multiple beams may support pivot platform 404. As shown, each beam may have a substantially linear configuration, such that a single beam supports each side of pivot platform 404. Beams 606, 608, 610, and 612 may extend diagonally between pivot platform 404 and base 402 to provide a substantial moment or bending arm, but the beams may also extend orthogonally from pivot platform 404, thereby minimizing the beam length. The multiple linear beam structure also permits pivot platform 404 to tip and tilt relative to base 402 in a manner similar to that discussed above. However, the mechanics of motion may be different from other embodiments, in that the linear beams may result in a stiffer structure. Thus, pivot platform 404 may still rotate about axis 602 or translate along axis 630, for example, but the degree of movement may be less per unit force applied as opposed to some of the preceding structural embodiments. Nonetheless, pivot platform 404 may self-align to another surface by tipping and tilting from its original position relative to base 402.

The preceding structural embodiments of micro pick up array mount 202 are intended to show the breadth of potential embodiments that are contemplated within the scope of this disclosure. Accordingly, these embodiments are in no way intended to be exhaustive, but are rather intended to suggest to one skilled in the art that a variety of beam structures and pivot configurations and placement may be used to achieve a self-aligning structure in which pivot platform 404 may move in multiple planes and along or about multiple axes relative to base 402.

Figure 7:
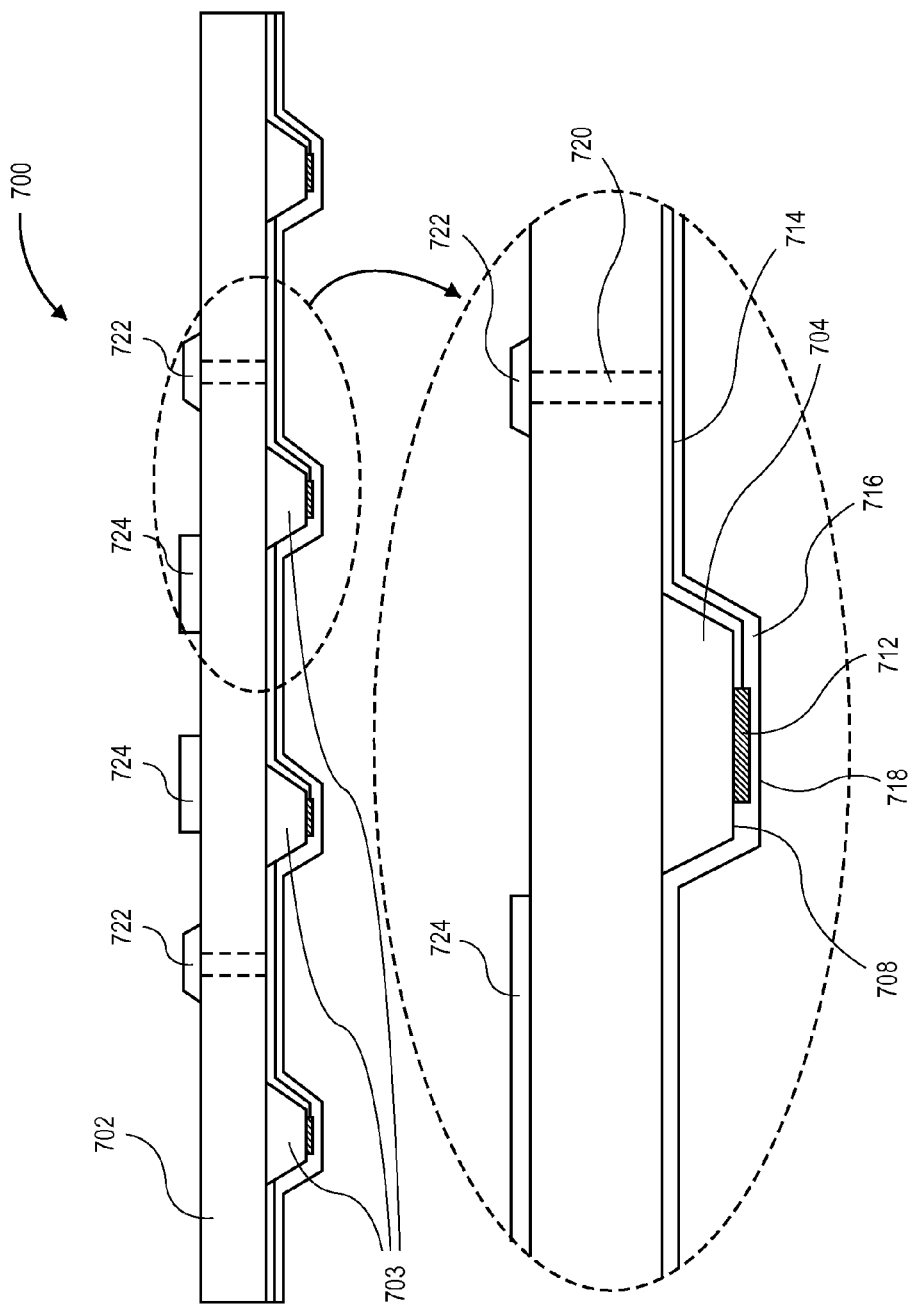
FIG. 7 is a side view illustration of a micro pick up array having a substrate supporting an array of electrostatic transfer heads in accordance with an embodiment of the invention.

Having discussed the basic structure and function of micro pick up array mount 202, further details will now be provided with respect to additional components that micro pick up array mount 202 may be mated to, assembled with, or otherwise combined to form a micro device transfer system. For example, micro pick up array mount 202 may be joined with a micro pick up array. Referring now to FIG. 7, a side view illustration of a micro pick up array having a substrate supporting an array of electrostatic transfer heads is shown in accordance with an embodiment of the invention. Micro pick up array 700 may include a base substrate 702, formed from one or more of silicon, ceramics, and polymers, supporting an array of electrostatic transfer heads 703. Each electrostatic transfer head 703 may include a mesa structure 704 including a top surface 708, which may support an electrode 712. However, electrode 712 is illustrative, and in another embodiment, mesa structure 704 can be wholly or partially conductive, such that electrode 712 is not necessary. A dielectric layer 716 covers a top surface of each mesa structure and electrode 712 if present. The top contact surface 718 of each electrostatic transfer head has a maximum dimension, for example a length or width of 1 to 100 µm, which may correspond to the size of a micro device to be picked up.

Mesa structure 704 protrudes away from base substrate 702 so as to provide a localized contact point of the top contact surface 718 to pick up a specific micro device during a pick up operation. In an embodiment, mesa structure 704 has a height of approximately 1 µm to 5 µm, or more specifically approximately 2 µm. In an embodiment, mesa structure 704 may have top surface 708 with surface area between 1 to 10,000 square micrometers. Mesa structure 704 may be formed in a variety of geometries, e.g., square, rectangular, circular, oval, etc., while maintaining this general surface area range. The height, width, and planarity of the array of mesa structures 704 on base substrate 702 are chosen so that each electrostatic transfer head 703 can make contact with a corresponding micro device during a pick up operation, and so that an electrostatic transfer head 703 does not inadvertently make contact with a micro device adjacent to an intended corresponding micro device during the pick up operation.

Still referring to FIG. 7, electrode lead 714 may place electrode 712 or mesa structure 704 in electrical connection with a terminal of via 720 and with substrate electrostatic voltage source contact 722. Substrate electrostatic voltage source contact 722 of the micro pick up array 700 is formed to align with the electrostatic voltage source contacts 420 on the micro pick up array mount 202 to transfer the operating voltage to the array of electrostatic transfer heads 703 when operably connected with the micro pick up array mount 202, as described in more detail with regard to FIGS. 8-9 below. Electrode lead 714, via 720, and substrate electrostatic voltage source contact 722 may be formed using methods similar to those described above for other leads, vias, contacts, and connections.

In addition to operating in accordance with electrostatic principles to pick up micro devices, the micro pick up array 700 may further be constructed to be secured or clamped to the micro pick up array mount 202 with electrostatic principles. As shown in the embodiment illustrated in FIG. 7, one or more clamp areas 724 may be formed on the backside of the micro pick up array 700 to align with the clamp electrodes 430 of the micro pick up array mount 202. In accordance with the principles of electrostatic grippers, using the attraction of opposite charges, a dielectric layer may be formed over the clamp electrodes 430 in the micro pick up array mount 202 and/or the clamp areas 724 on the micro pick up array 700. Clamp areas 724 can be formed by a variety of methods and assume a variety of configurations. In one embodiment, clamp areas 724 are conductive pads, such as a metal or semiconductor film, formed on the back surface of the micro pick up array 700. The conductive pads may be electrically isolated from the other active regions of the micro pick up array 700. For example, insulating layers may be formed under, over, and around the conductive pads. In another embodiment, the clamp areas 724 may be integrally formed with the micro pick up array, for example bulk silicon, and electrically isolated from the other active regions of the micro pick up array 700.

Figure 8A:
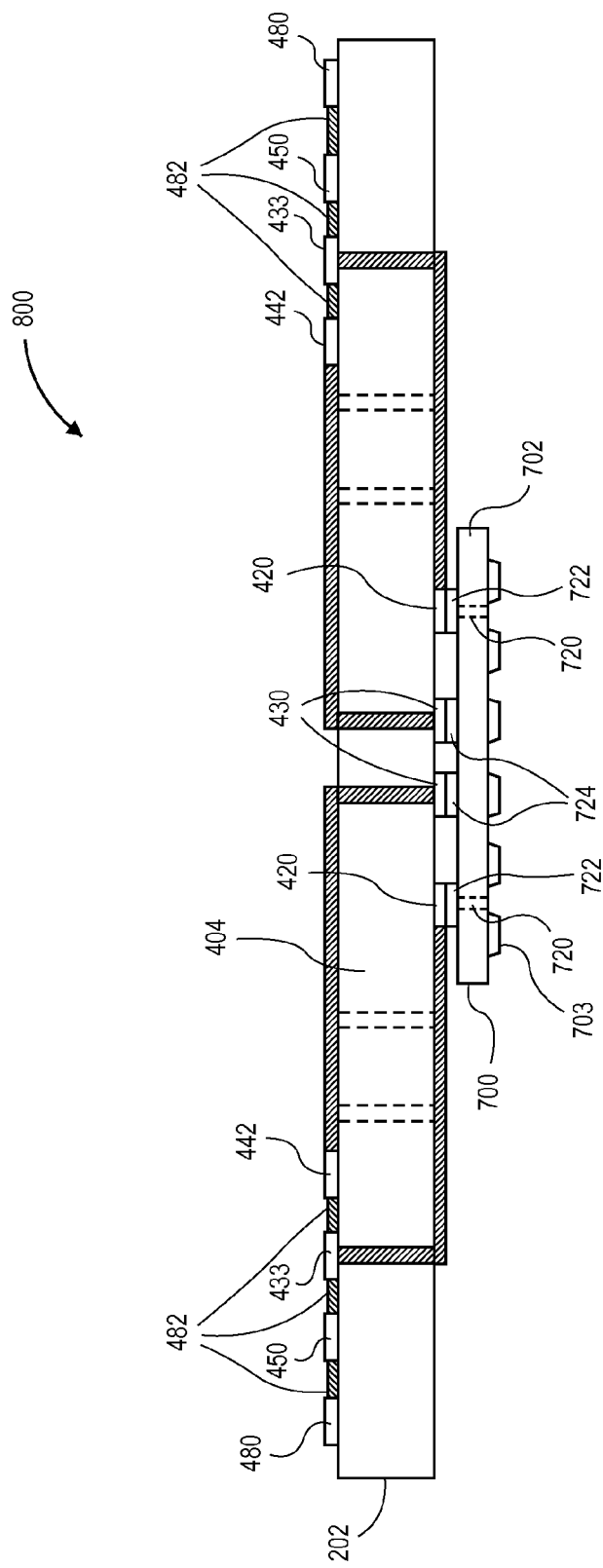
FIG. 8A is a side view illustration of a micro device transfer system including a micro pick up array mount electrostatically bonded with a micro pick up array in accordance with an embodiment of the invention.

Referring to FIG. 8A, a side view illustration of a micro device transfer system including a micro pick up array mount electrostatically bonded with a micro pick up array is shown in accordance with an embodiment of the invention. Micro pick up array system 800 includes micro pick up array mount 202 and micro pick up array 700, which is joinable with micro pick up array mount 202. More specifically, micro pick up array 700 may be both physically and electrically joined with micro pick up array mount 202, as described below.

Micro pick up array 700 may be physically joined with micro pick up array mount 202 through a temporary bond. For example, clamp electrode 430 may be positioned adjacent to clamp areas 724 of substrate 702. Upon applying an electrostatic voltage through the clamping voltage path from base clamp contacts 442 to clamp electrodes 430, an electrostatic gripping pressure will be applied to substrate 702, causing micro pick up array 700 to physically bond to micro pick up array mount 202. This bond is reversible, in that discontinuation of the electrostatic voltage applied to clamp electrode 430 may remove the bond and release micro pick up array 700 from micro pick up array mount 202. Thus, micro pick up array 700 will be temporarily adjoined to micro pick up array mount 202 to form micro device transfer system 800. As described above, in accordance with the principles of electrostatic grippers, using the attraction of opposite charges, a dielectric layer is formed over the clamp electrodes 430 in the micro pick up array mount 202 and/or the clamp areas 724 on the micro pick up array 700.

Micro pick up array mount 202 may also be operably joined with micro pick up array 700. More particularly, substrate electrostatic voltage source contact 722 of micro pick up array 700 may be aligned with, and placed adjacent to, pivot platform electrostatic voltage source contact 420. In this way, a voltage applied to base electrostatic voltage source connection 433 is transferred through the micro pick up array mount 202 to pivot platform electrostatic voltage source contact 420, which is electrically connected to substrate electrostatic voltage source contact 722, and to the array of electrostatic transfer heads 703. Thus, micro pick up array mount 202 and micro pick up array 700 may be electrically connected to enable an electrostatic voltage to be applied through the operating voltage path from base electrostatic voltage source connection 433 to the array of transfer heads 703 in order to generate an electrostatic gripping force on an array of micro devices.

Heat can be delivered from micro pick up array mount 202 to micro pick up array 700 and/or to an array of micro devices gripped by micro pick up array 700 when those components are joined to form micro device transfer system 800. As shown in FIG. 8A, in an embodiment, heating contacts 480 on micro pick up array mount 202 can relay electrical current through heating leads 482 to heating element 484 (shown in FIG. 8B) on pivot platform 404. In this manner, heating element 484 can be resistively heated. Thus, heat from heating element 484 on the bottom surface of micro pick up array mount 202 may transfer through pivot platform 404 to micro pick up array 700. Furthermore, the heat delivered to micro pick up array 700 may dissipate through electrostatic transfer heads 210 into an array of micro devices gripped by electrostatic transfer heads 210.

Figure 8B:
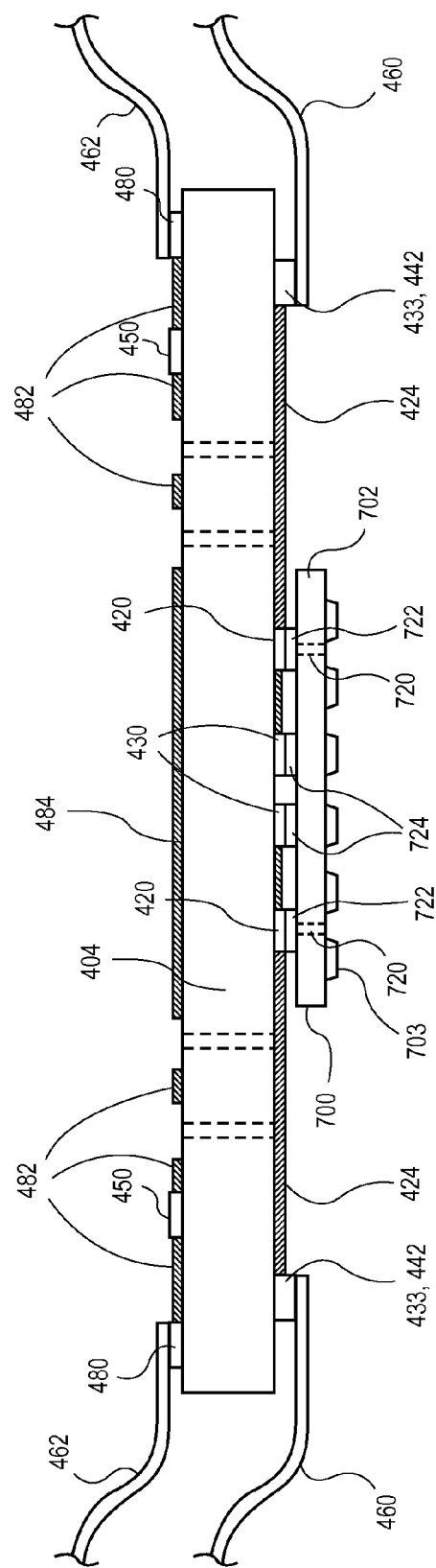
FIG. 8B is a side view illustration of a micro device transfer system including a micro pick up array mount electrostatically bonded with a micro pick up array in accordance with an embodiment of the invention.

Referring to FIG. 8B, a side view illustration of a micro device transfer system including a micro pick up array mount electrostatically bonded with a micro pick up array is shown in accordance with an embodiment of the invention. Micro pick up array 700 may include substrate electrostatic voltage source contact 722 and clamp areas 724 placed in electrical communication with electrostatic voltage source contacts 420 and clamp electrodes 430, respectively. As discussed above electrostatic voltage source contacts 420 and clamp electrodes 430 may be interconnected with base electrostatic voltage source contact 433 and base clamp contact 442, respectively. Furthermore, ribbon cable 460 can supply voltage to base electrostatic voltage source contact 433 and base clamp contact 442 from an external component, such as electrostatic voltage sources of a transfer head assembly 206. Thus, a complete electrical pathway is formed between the electrostatic voltage sources and the substrate.

In an alternative embodiment, ribbon cables 462 can electrically connect with one or more contacts on the bottom surface of micro pick up array mount 202. For example, ribbon cable 462 may supply electrical current to heating contacts 480, and the electrical current can be relayed through heating leads 482 to raise the temperature of heating element 484. In this manner, heat can be transferred from heating element 484 through pivot platform 404 to micro pick up array 700.

In an alternative embodiment, an electrical lead of ribbon cables 462 may be connected with base electrostatic voltage source contact 433 or base clamp contact 442 when they are located on a bottom surface of micro pick up array mount 202, such as their position in FIG. 8A. In this case, an operating voltage and clamping voltage delivered through ribbon cables 462 may then be transferred to electrostatic voltage source contacts 420 and clamp electrodes 430 on a top surface of micro pick up array mount 202 through vias and traces.

Figure 9A:
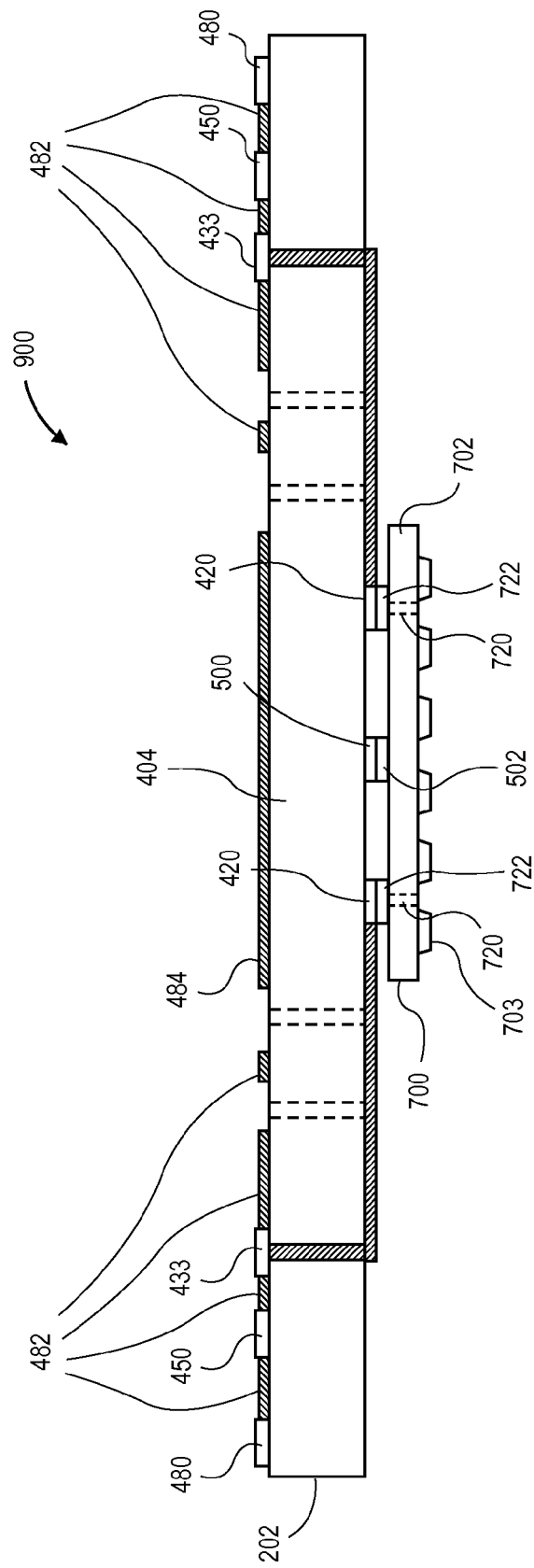
FIG. 9A is a side view illustration of a micro device transfer system including a micro pick up array mount permanently bonded with a micro pick up array in accordance with an embodiment of the invention.

Referring to FIG. 9A, a side view illustration of a micro device transfer system including a micro pick up array mount permanently bonded with a micro pick up array is shown in accordance with an embodiment of the invention. Micro pick up array 700 may be permanently bonded to micro pick up array mount 202 to form micro device transfer system 900. Micro pick up array mount 202 may include bonding pad 500. Bonding pad 500 may be formed of a variety of materials including polymers, solders, metals, and other adhesives. To further facilitate bonding, a bonding pad 502 may be formed on substrate 702 in addition to, or alternative to bonding pad 500. In an embodiment, bonding pads 500 and/or 502 are formed of a metallic material and the substrates micro pick up array mount 202 and micro pick up array 700 are bonded together with a thermocompression bond. Thus, in at least one embodiment, micro pick up array 700 may be permanently adjoined to micro pick up array mount 202 to form micro device transfer system 900. Prior to permanently bonding micro pick up array mount 202 and micro pick up array 700, the electrical contacts of those components may be aligned to ensure that the bonded components remain in electrical connection with one another. More particularly, alignment of pivot platform electrostatic voltage source contact 420 and substrate electrostatic voltage source contact 722 are aligned.

Heat can be delivered from micro pick up array mount 202 to micro pick up array 700 and/or to an array of micro devices gripped by micro pick up array 700 when those components are joined to form micro device transfer system 900. As shown in FIG. 9A, in an embodiment, heating contacts 480 on micro pick up array mount 202 can relay electrical current through heating leads 482 to heating element 484. Heating element 484 can be resistively heated by the current, and heat may therefore transfer from heating element 484 on the bottom surface of micro pick up array mount 202 through pivot platform 404 to micro pick up array 700.

In an alternative embodiment, an electrical lead of ribbon cables 462 may be connected with base electrostatic voltage source contact 433 when it is located on a bottom surface of micro pick up array mount 202, such as its position in FIG. 9A. In this case, an operating voltage delivered through ribbon cables 462 may then be transferred to electrostatic voltage source contacts 420 on a top surface of micro pick up array mount 202 through vias and traces.

Figure 9B:
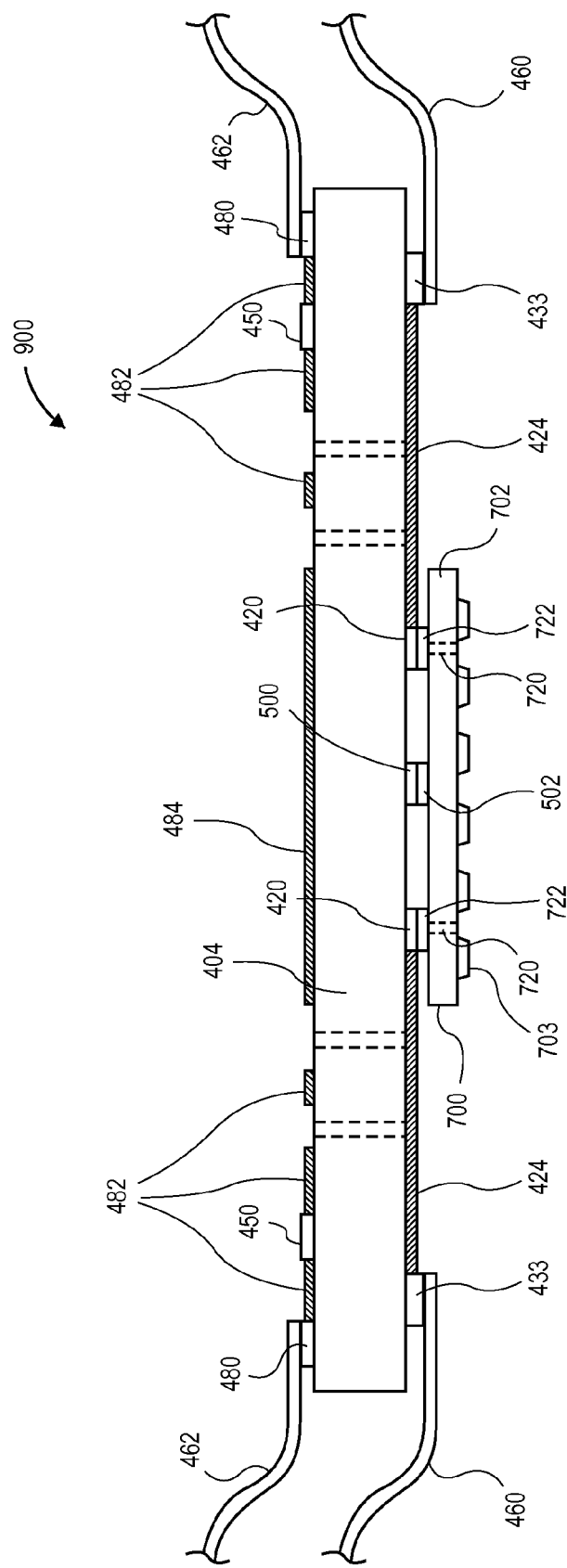
FIG. 9B is a side view illustration of a micro device transfer system including a micro pick up array mount permanently bonded with a micro pick up array in accordance with an embodiment of the invention.

Referring to FIG. 9B, a side view illustration of a micro device transfer system including a micro pick up array mount permanently bonded with a micro pick up array is shown in accordance with an embodiment of the invention. Ribbon cables 460 can be placed in electrical communication with base electrostatic voltage source contact 433 to supply voltage from an external component, such as an electrostatic voltage source of the transfer head assembly 206, through the various traces, contacts, and connections of micro pick up array mount 202 and micro pick up array 700, into electrostatic transfer heads 703.

In an embodiment, ribbon cable 462 can supply electrical current to heating contacts 480, and the electrical current can be relayed through heating leads 482 to raise the temperature of heating element 484. Thus, heat can be transferred from heating element 484 through pivot platform 404 to micro pick up array 700.

Figure 10A:
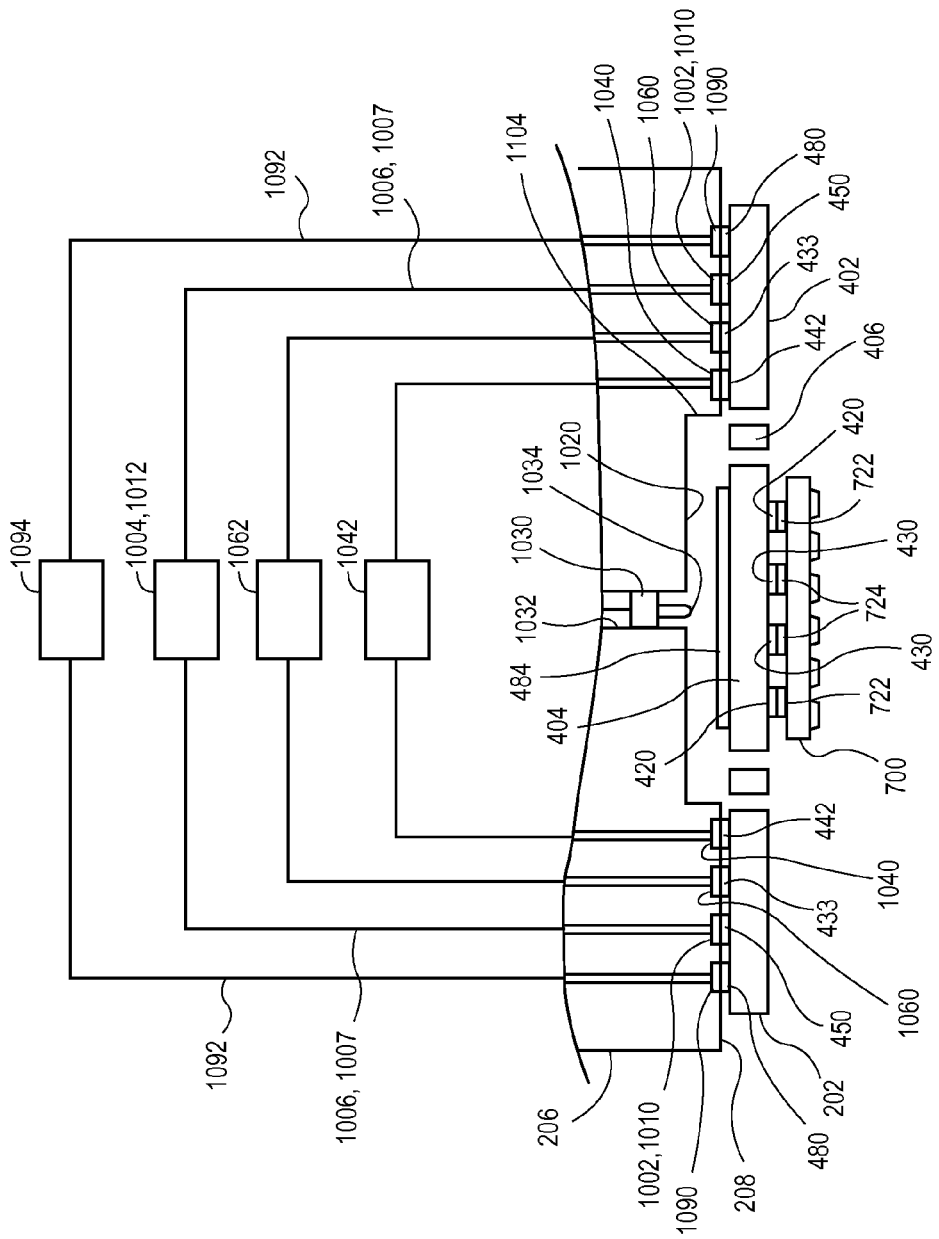
FIG. 10A is a cross-sectional side view illustration showing a portion of a micro device transfer system including a transfer head assembly holding a micro pick up array mount with a micro pick up array mounted on the micro pick up array mount in accordance with an embodiment of the invention.

Referring to FIG. 10A, a cross-sectional side view illustration showing a portion of a micro device transfer system including a transfer head assembly holding a micro pick up array mount with a micro pick up array mounted on the micro pick up array mount is shown in accordance with an embodiment of the invention. As described above, micro pick up array 700 may be attached to micro pick up array mount 202 through either a temporary or a permanent bond. Similarly, micro pick up array mount 202 may be joined with transfer head assembly 206 in numerous ways. For example, an attachment may be formed pneumatically, electrostatically, or mechanically.

In an embodiment, micro pick up array mount 202 may be placed against mounting surface 208 of a transfer head assembly, and a holding mechanism of transfer head assembly 206 may be activated to retain micro pick up array mount 202. For example, in at least one embodiment the micro pick up array mount 202 may be releasably attached and detached from the mounting surface 208 by applying a suction through vacuum port 1002 in mounting surface 208. Vacuum port 1002 may be coupled with vacuum source 1004 for drawing suction on an object placed against mounting surface 208. More particularly, when micro pick up array mount 202, is positioned against mounting surface 208, suction may be drawn through vacuum port 1002 to create a negative pressure within one or more vacuum channels 1006. Thus, micro pick up array mount 202 may be pushed against the mounting surface 208 by the pressure difference between vacuum channel 1006 and the surrounding atmosphere. As a result, micro pick up array mount 202 attaches to mounting surface 208. When the vacuum source is disconnected or the negative pressure in the vacuum channel 1006 is insufficient to retain micro pick up array mount 202, the attachment is discontinued and the micro pick up array mount 202 may be released and removed.

In an alternative embodiment, micro pick up array mount 202 may be retained against mounting surface 208 by an electrostatic force. In such an embodiment, rather than applying suction to micro pick up array mount 202 through vacuum port 1002, clamping electrode 1010 and lead 1007 may replace vacuum port 1002 and vacuum channel 1006. Electrostatic voltage may be applied to clamping electrode 1010 from an electrostatic voltage source 1012, which replaces the vacuum source 1004. In such an embodiment, micro pick up array mount 202 may include a clamp area 450.

Thus, when the clamp areas 450 are placed adjacent the clamping electrodes 1010, an electrostatic force may be applied to retain the micro pick up array mount 202 against the mounting surface 208.

Numerous other manners of retaining micro pick up array mount 202 may be used so that the use of vacuum or electrostatic clamping components is not required. For example, in yet another embodiment, one or more mechanical fasteners may be used to retain micro pick up array mount 202 against mounting surface 208. As an example, screws can be placed in through holes formed in base 402 and threaded into counter bored holes in mounting surface 208 such that a head of the screw, e.g., of a cap screw, will retain the base 402 against the mounting surface 208. Alternatively, clips can be used, such as spring loaded clips, to fasten the base against the mounting surface 208. In this case, the clips can apply a fastening load to base 402 on the same side as of micro pick up array mount 202 that receives a micro pick up array 700. Other mechanical retaining features such as pins may be used to retain micro pick up array mount 202 against mounting surface 208. Additionally, alternative bonding mechanisms, such as adhesives can be used to retain the micro pick up array mount 202. For example, an appropriate adhesive can be used to form a bond between mounting surface 208 and base 402, depending on the materials used to form transfer head assembly 206 and micro pick up array mount 202.

Transfer head assembly 206 may include electrical interconnects for supplying a clamping voltage to micro pick up array mount 202 for holding the micro pick up array 700. For example, as described above, micro pick up array mount 202 may include clamp electrode 430 for applying a gripping pressure to micro pick up array 700. In order to induce this gripping pressure, transfer head assembly 206 may supply an electrostatic voltage to base clamp contact 442. More particularly, clamping voltage source connection 1040 of transfer head assembly 1002 may supply voltage delivered from an electrostatic voltage source 1042 connected to clamping voltage source connection 1040 by wires or other electrical connections. As discussed above, the electrostatic voltage delivered to clamp electrode 430 permits micro pick up array mount 202 to physically join with micro pick up array 700.

In another embodiment, micro pick up array 700 may alternatively be retained against micro pick up array mount 700 using vacuum. For example, in an embodiment, vacuum channels may run through transfer head assembly 206 and micro pick up array mount 202, terminating in a vacuum port that apposes the back surface of micro pick up array 700. The vacuum channels may form a singular conduit as a result of being aligned and sealed at the interfaces of the various components, using sealing components that are known in the art. Furthermore, channels may run through the wall of micro pick up array 700, e.g., extending from base 402, through the lengths of beams 406, and into pivot platform 404, eventually terminating at a mounting surface 205 of pivot platform 404. In such an embodiment, the vacuum channels may be connected to a vacuum source (not shown) to create a suction that retains micro pick up array 700 against micro pick up array mount 202.

Transfer head assembly 206 may also include electrical interconnects for supplying an operating voltage to the micro pick up array 700. As described above, an electrostatic voltage may be the electrostatic transfer heads 703 of micro pick up array 700 to apply a gripping pressure to adjacent micro devices. In order to induce this gripping pressure, transfer head assembly 206 may supply an electrostatic voltage to substrate electrostatic voltage source contact 722 through micro pick up array mount 202. More particularly, electrostatic voltage source connection 1060 may supply electrostatic voltage to base electrostatic voltage source contact 433 from an electrostatic voltage source 1062 connected with electrostatic voltage source connection 1060 by various wires or other electrical interconnects. As discussed above, the electrostatic voltage delivered to base electrostatic voltage source contact 433 may propagate through various vias, traces, and connections in the operating voltage path to the electrostatic transfer heads 703.

Transfer head assembly 206 may further include electrical interconnects for supplying a heating current to micro pick up array mount 202. As described above, an electrical current may be introduced to heating contacts 480 to raise the temperature of heating element 484. Heating contacts 480 of micro pick up array mount 202 may be placed in electrical connection with heating connection 1090 of transfer head assembly 206 to receive the electrical current. More particularly, heating connection 1090 can transfer electrical current supplied by heating current source 1094 through heating connection leads 1092. As discussed above, running electrical current through heating element 484 causes the element to generate heat that may transfer to micro pick up array 700 mounted on micro pick up array mount 202. More particularly, heat may be transferred from heating element 484 to micro devices placed in contact with array of electrostatic transfer heads 703 on micro pick up array 700.

Transfer head assembly 206 may further include recessed surface 1020, which is generally configured to align with and receive pivot platform 404 and beams 406 when pivot platform 404 is deflected relative to base 402. For example, recessed surface 1020 and sidewall profile 1104 are formed within the mounting surface 208 of the transfer head assembly 206 to form a cavity. Thus, pivot platform 404 may float over the cavity in the mounting surface 208, which retains base 402, for example, rigidly, using one or more of the retention techniques described above.

Micro device transfer system 200 may also include a sensor 1030 to detect deflection of the micro pick up array mount 202. In an embodiment, sensor 1030 is fixed relative to transfer head assembly 206. More particularly, sensor 1030 may include a threaded body that is screwed into a sensor channel 1032 extending from recessed surface 1020. Furthermore, sensor 1030 may include probe 1034, configured to extend beyond recessed surface 1020 in the direction of pivot platform 404. Accordingly, when pivot platform 404 of micro pick up array mount 202 is undeflected, probe 1034 of sensor 1030 will remain in an extended state. Sensor 1030 may be a contact sensor and probe 1034 may be a spring-loaded probe of the contact sensor. The contact sensor may act as a switch or a feedback mechanism. For example, sensor 1030 may be a switch with a normally opened state when probe 1034 is in an extended position.

In an embodiment, sensor 1030 may effectively be a contact of an open circuit. In such a case, the open circuit may close when the contact is touched by pivot platform 404 or another conductive portion of micro pick up array mount 202. More specifically, a source may supply voltage to a lead that extends from a positive terminal of the source to sensor 1030. Furthermore, a lead may extend from a negative terminal of the source to a surface of micro pick up array mount 202. The surface may be metallized, for example, to increase the local conductivity. Thus, when sensor 1030 contacts the surface of micro pick up array mount 202, the circuit may close and current flows through the circuit. This current may be sensed by an external sensor, e.g., by a current sensor, that then delivers a signal to computer system 150 indicating whether the micro pick up array mount 700 has deflected into contact with sensor 1030.

A contact sensor is only one example of a sensor that may be used to detect deflection of the micro pick up array mount 202. For example, non-contact sensors, including laser interferometers capable of sensing absolute position of a remote object, may be used to detect when the pivot platform 404 has deflected from an original position and/or come into contact with recessed surface 1020. In other embodiments sensor 1030 may include proximity sensors, optical sensors, and ultrasonic sensors.

One or more of these sensors may determine movement of pivot platform 404 without acting as a hard stop that prevents additional movement of pivot platform 404 as it deflects. In other words, sensor 1030, whether of a contact or non-contact type, may detect movement of pivot platform 404 without impeding the deflection of pivot platform 404.

Sensor 1030 may provide input and feedback to computer system 150 that controls various actuators of mass transfer tool 100. For example, sensor 1030 may be connected with I/O ports of computer system 150 to deliver signals related to the sensor 1030 being in an open or closed state. Based on the sensor 1030 state, computer system 150 may determine whether a specific condition is met, e.g., whether micro pick up array mount 202 is in a deflected condition, and thus, may provide control signals to actuators or intermediate motion controllers to regulate the movement of mass transfer tool 100.

Figure 10B:
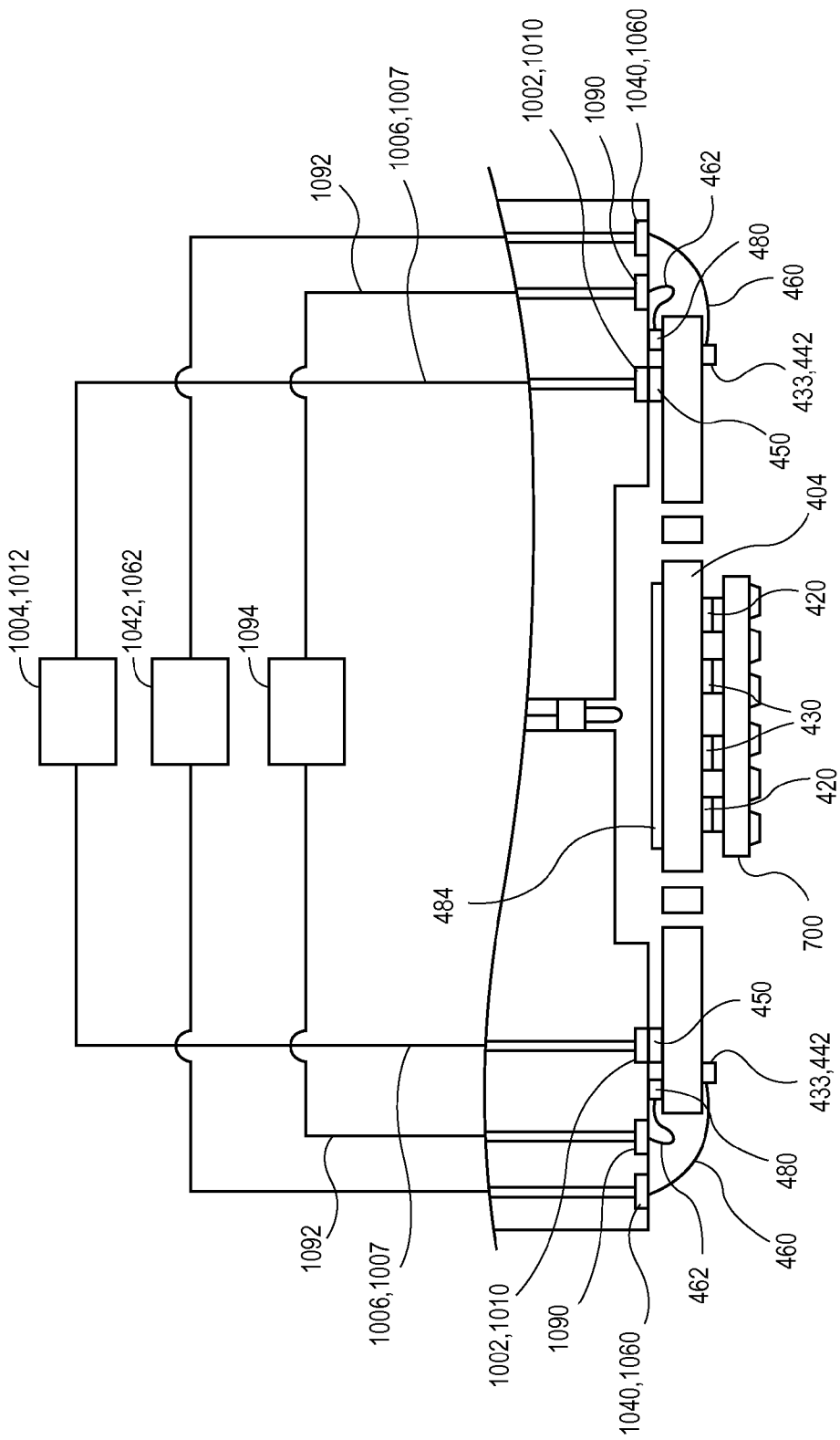
FIG. 10B is a cross-sectional side view illustration showing a portion of a micro device transfer system including a transfer head assembly holding a micro pick up array mount with a micro pick up array mounted on the micro pick up array mount in accordance with an embodiment of the invention.

Referring to FIG. 10B, a cross-sectional side view illustration showing a portion of a micro device transfer system including a transfer head assembly holding a micro pick up array mount with a micro pick up array mounted on the micro pick up array mount is shown in accordance with an embodiment of the invention. Micro pick up array mount 202 illustrated in FIG. 10B may be retained against the mounting surface 208 of the transfer head assembly in any of the manners described above with regard to FIG. 10A, such as mechanical fastening, adhesive, vacuum, electrostatic, etc. The electrical interconnects and supply routes of transfer head assembly 206 illustrated in FIG. 10B can be varied to incorporate ribbon cables. More particularly, ribbon cables 460 can include an electrical wire interconnecting base electrostatic voltage source contact 433 with electrostatic voltage source connection 1060, as well as an electrical wire interconnecting base clamp contact 442 with clamping voltage source connection 1040. Thus, voltage can be supplied to base electrostatic voltage source contact 433 and base clamp contact 442 from electrostatic voltage sources 1062 and 1042, respectively. Furthermore, ribbon cables 462 can include an electrical wire interconnecting heating contact 480 with heating connection 1090. Thus, electrical current can be supplied to heating contact 480 from heating current source 1094. Ribbon cables 460 and 462 can also be used to communicate electrical signals for a variety of purposes between transfer head assembly 206 and micro pick up array mount 202. For example, ribbon cables 460 and 462 can be used to transfer electrical signals from sensors, such as temperature sensor 440, placed on a surface of micro pick up array mount 202 or micro pick up array 700. Therefore, in an embodiment, micro pick up array mount 202 does not include vias to transfer voltage or current from transfer head assembly 206 to micro pick up array 700.

Figure 11:
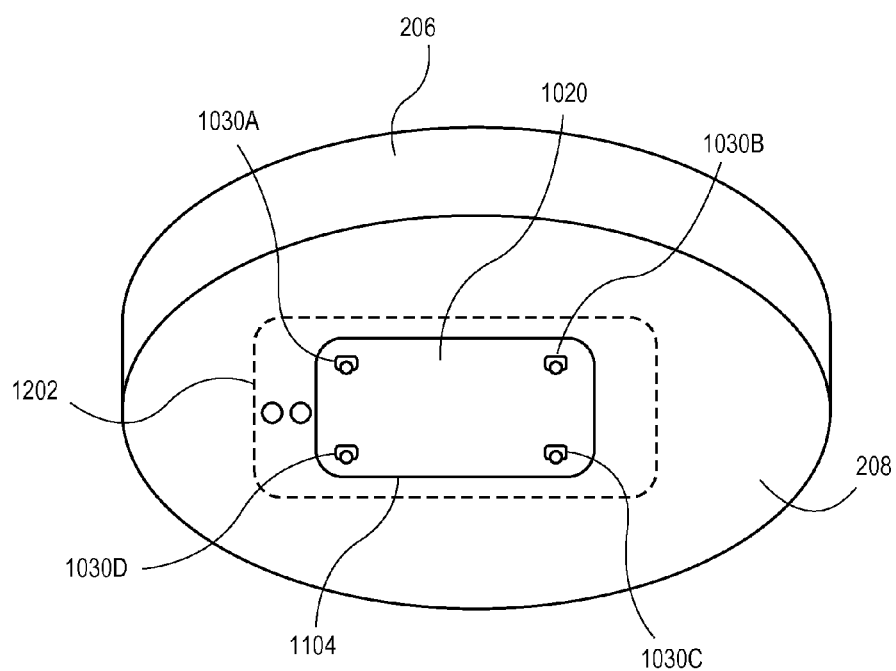
FIG. 11 is a perspective view illustration of a transfer head assembly having multiple sensors to detect deflection of a micro pick up array mount in accordance with an embodiment of the invention.

Referring to FIG. 11, a perspective view illustration of a transfer head assembly having multiple sensors to detect deflection of a micro pick up array mount is shown in accordance with an embodiment of the invention. Several sensors 1030 may be located at various locations on transfer head assembly 206. For example, sensors 1030a-1030d may be located in each corner of the recessed portion of mounting surface 208, i.e., in each corner of recessed surface 1020. Multiple sensors 1030 provides more response to deflection of micro pick up array mount 202 in that each sensor 1030 may sense deflection of a different area of micro pick up array mount 202. For example, sensor 1030a in one corner of recessed surface 1020 may sense deflection of one corner of pivot platform 404 while sensor 1030 in another corner of recessed surface 1020 may sense deflection of another corner of pivot platform 404. In this way, uneven deflection of pivot platform 404 relative to base 402 may be detected.

As mentioned above, pivot platform 404 may have a profile that is smaller than recessed portion profile 1104 to ensure that pivot platform 404 is able to deflect. Likewise, base profile 1202 of base 402, indicated by a dotted line, may have a larger profile than recessed portion profile 1104 and therefore may remain rigidly fixed relative to mounting surface 208 even when a deflecting force is applied to pivot platform 404. That is, base 402 may be apposed by mounting surface 208 to resist base 402 movement and facilitate relative movement between base 402 and deflected pivot platform 404. Nonetheless, in at least one embodiment, a portion of base 402 could be smaller than recessed portion profile 1104 while still allowing pivot platform 404 to move relative to base 402.

Figure 12:
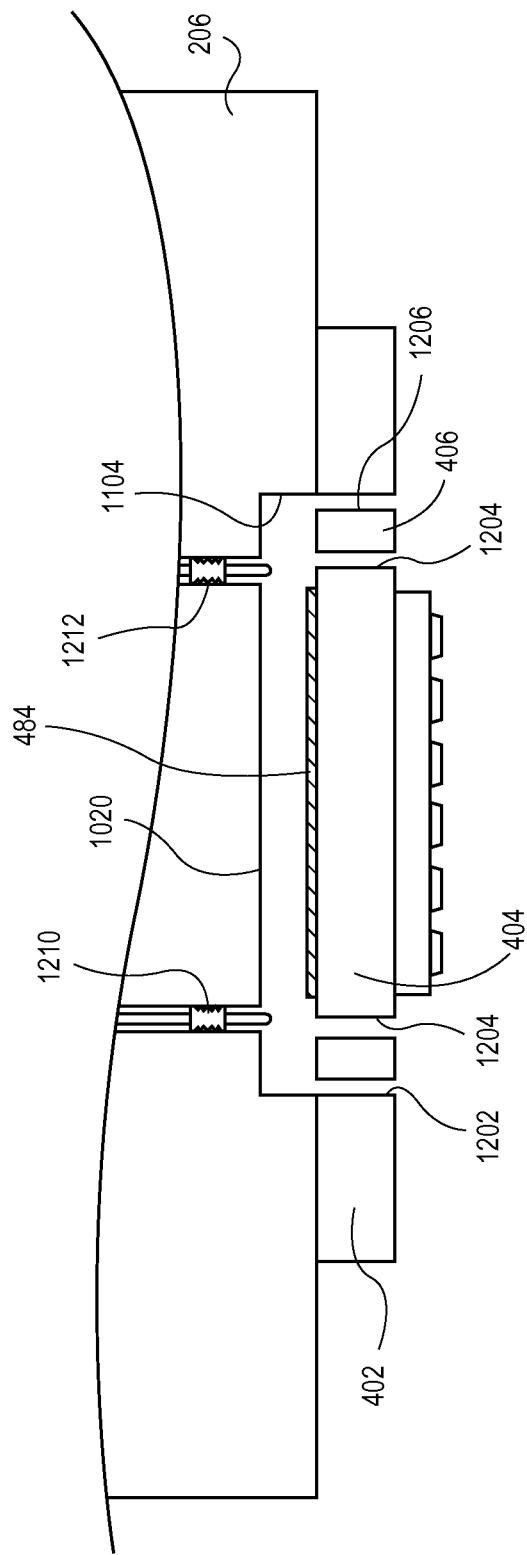
FIG. 12 is a cross-sectional side view illustration showing a portion of a micro device transfer system including a transfer head assembly holding a micro pick up array mount with a micro pick up array mounted on the micro pick up array mount and the transfer head assembly having multiple sensors to detect deflection of the micro pick up array mount in accordance with an embodiment of the invention.

Referring to FIG. 12, a cross-sectional side view illustration showing a portion of a micro device transfer system including a transfer head assembly holding a micro pick up array mount with a micro pick up array mounted on the micro pick up array mount and the transfer head assembly having multiple sensors to detect deflection of the micro pick up array is shown in accordance with an embodiment of the invention. Further to the description provided above, base 402 may include an inner edge 1202 having a profile that is larger than, or equal to, recessed portion profile 1104, indicated here by a wall of the recessed portion. Also, pivot platform 404 includes an outer edge 1204 having a profile that is smaller than recessed portion profile 1104. Likewise, beam 406 may include an outer edge 1206 having a profile that is smaller than recessed portion profile 1104.

Sensor 1210 and sensor 1212 are shown aligned with opposite corners of pivot platform 404. Thus, sensors 1210 and 1212 will individually sense deflection of pivot platform 404, and provide feedback related to pivot platform 404 position. More particularly, if a corner of pivot platform 404 adjacent to outer edge 1204 deflects, it will trigger sensor 1212, which may either trigger a signal as an input to computer system 150, or may act as a switch that directly controls a motor or other actuator that controls motion of the micro device transfer system relative to a carrier substrate or receiving substrate. Similarly, if a corner of pivot platform 404 adjacent to outer edge 1204 deflects, it will trigger sensor 1210 control motion.

Figure 13:
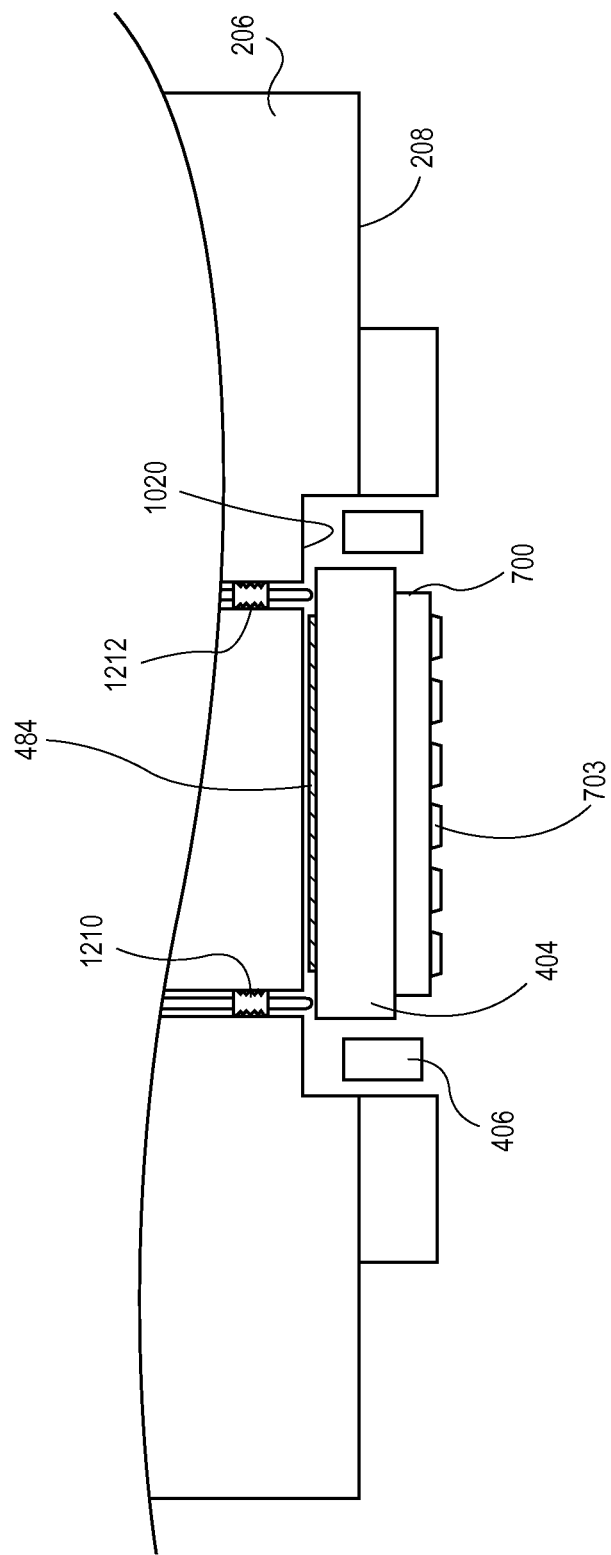
FIG. 13 is a cross-sectional side view illustration showing a portion of a micro device transfer system including a transfer head assembly holding a micro pick up array mount with a micro pick up array mounted on the micro pick up array mount and the micro pick up array mount deflected toward sensors on the transfer head assembly in accordance with an embodiment of the invention.

Referring to FIG. 13, a cross-sectional side view illustration showing a portion of a micro device transfer system including a transfer head assembly holding a micro pick up array mount with a micro pick up array mounted on the micro pick up array mount and the micro pick up array mount deflected toward sensors on the transfer head assembly is shown in accordance with an embodiment of the invention. This embodiment illustrates a scenario in which pivot platform 404 is in a deflected state. Such deflection may occur, for example, when the array of electrostatic transfer heads 703 of micro pick up array 700 come into contact with an array of micro devices, a carrier substrate, a receiving substrate, or another external object. Pressure placed on the array of electrostatic transfer heads 703 causes deflection of pivot platform 404 and beam 406. As a result, those components may move into the recessed profile 1104 of mounting surface 208, eventually contacting and triggering sensors 1210 and 1212. Although pivot platform 404 is shown as being flush with recessed surface 1020, pivot platform 404 could be tilted. For example, array of electrostatic transfer heads 703 could contact a carrier substrate plane that is not parallel to recessed surface 1020, and thus, as pivot platform 404 deflects into recessed portion 1020, it may tilt and trigger only one of the sensors, or depress one sensor more than another. Sensors 1210 and 1212 may be configured to sense such uneven deflection of pivot platform 404 and to provide feedback to control motion of the mass transfer tool 100 accordingly.

Figure 14:
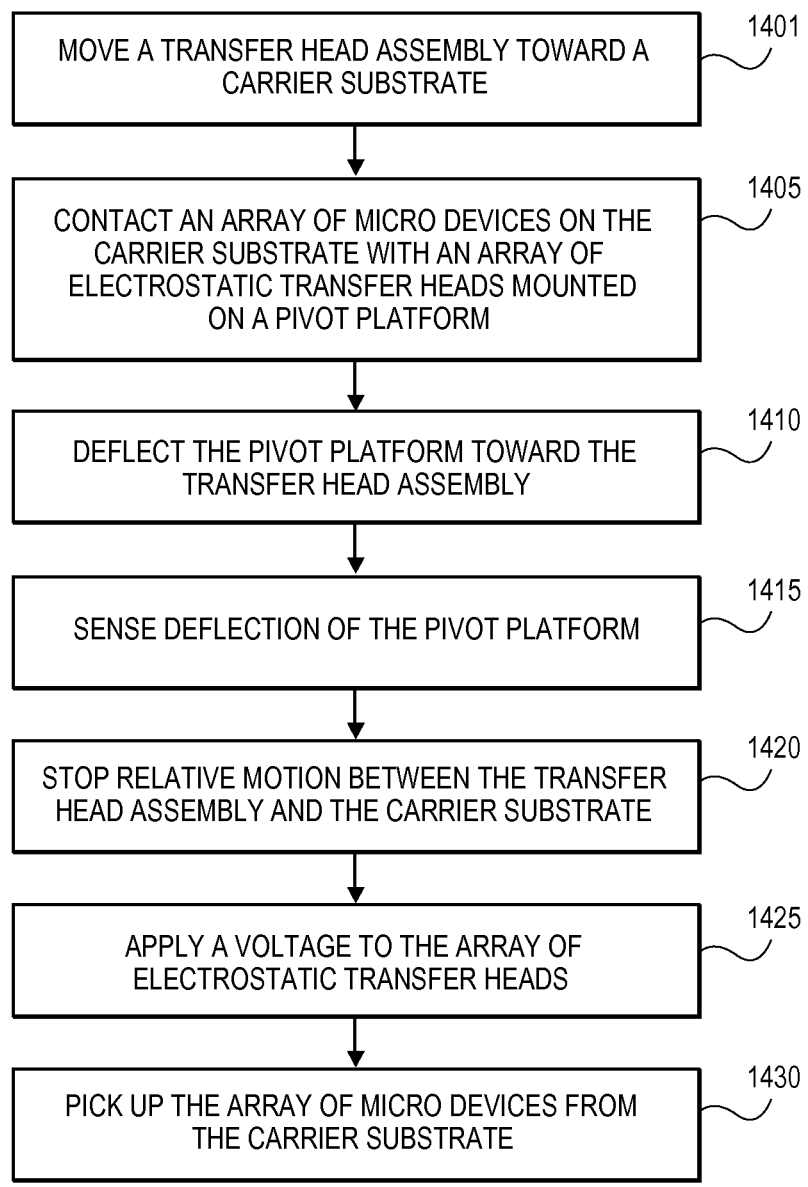
FIG. 14 is a flowchart illustrating a method of picking up an array of micro devices from a carrier substrate in accordance with an embodiment of the invention.
Figure 15A:
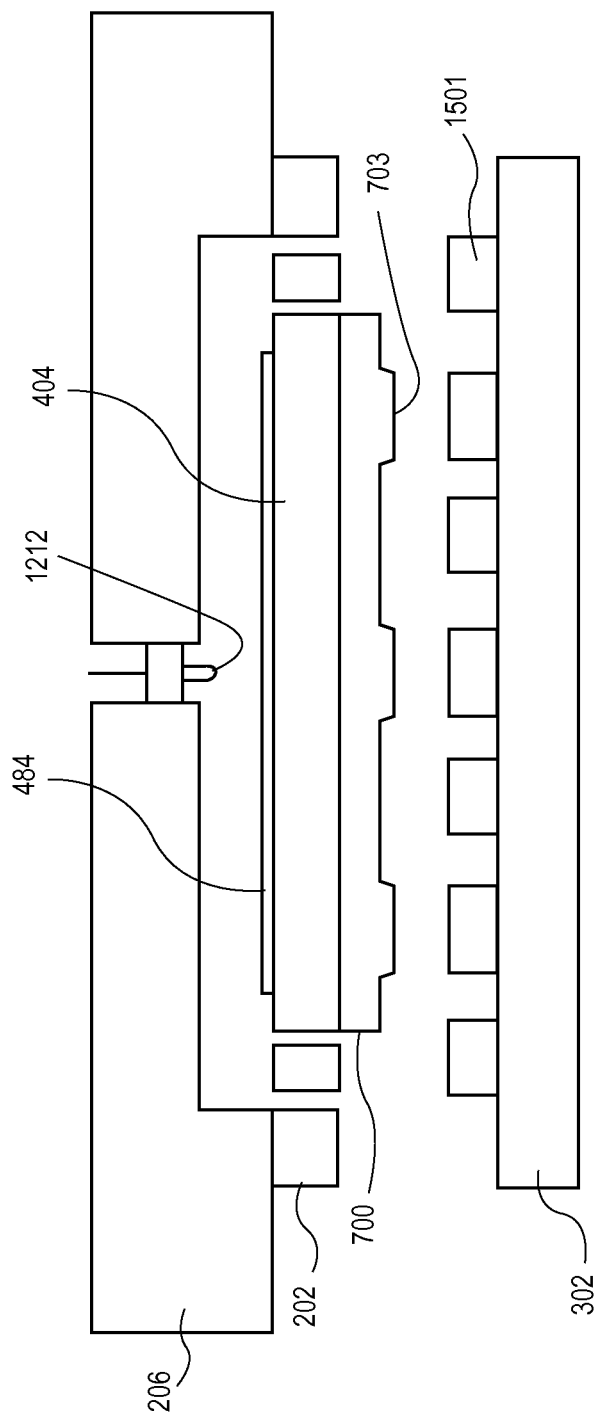
FIG. 15A is a cross-sectional side view illustration of a micro device transfer system having a transfer head assembly moving toward a carrier substrate in accordance with an embodiment of the invention.

Referring to FIG. 14, a flowchart illustrating a method of picking up an array of micro devices from a carrier substrate is shown in accordance with an embodiment of the invention. For illustrational purposes, the following description of FIG. 14 is also made with reference to the embodiments illustrated in FIGS. 15A-15D. At operation 1401, transfer head assembly 206 is moved toward carrier substrate 302. Referring to FIG. 15A, a cross-sectional side view illustration of a micro device transfer system having a transfer head assembly moving toward a carrier substrate is shown in accordance with an embodiment of the invention. The micro pick up array 700 may be mounted on micro pick up array mount 202, which is held against transfer head assembly 206. As shown, pivot platform 404 may be undeflected, with a gap between an upper surface of pivot platform 404 and one or more sensors 1212. Furthermore, the micro device transfer system is shown prior to contact being made between the array of electrostatic transfer heads 703 and the array of micro devices 1501 carried on the carrier substrate 302, and thus, there is a gap between those components. In this state, transfer head assembly 206 may be connected with various actuators of mass transfer tool 100, which move transfer head assembly 206 toward carrier substrate 302 under the direct or indirect control of computer system 150.

Figure 15B:
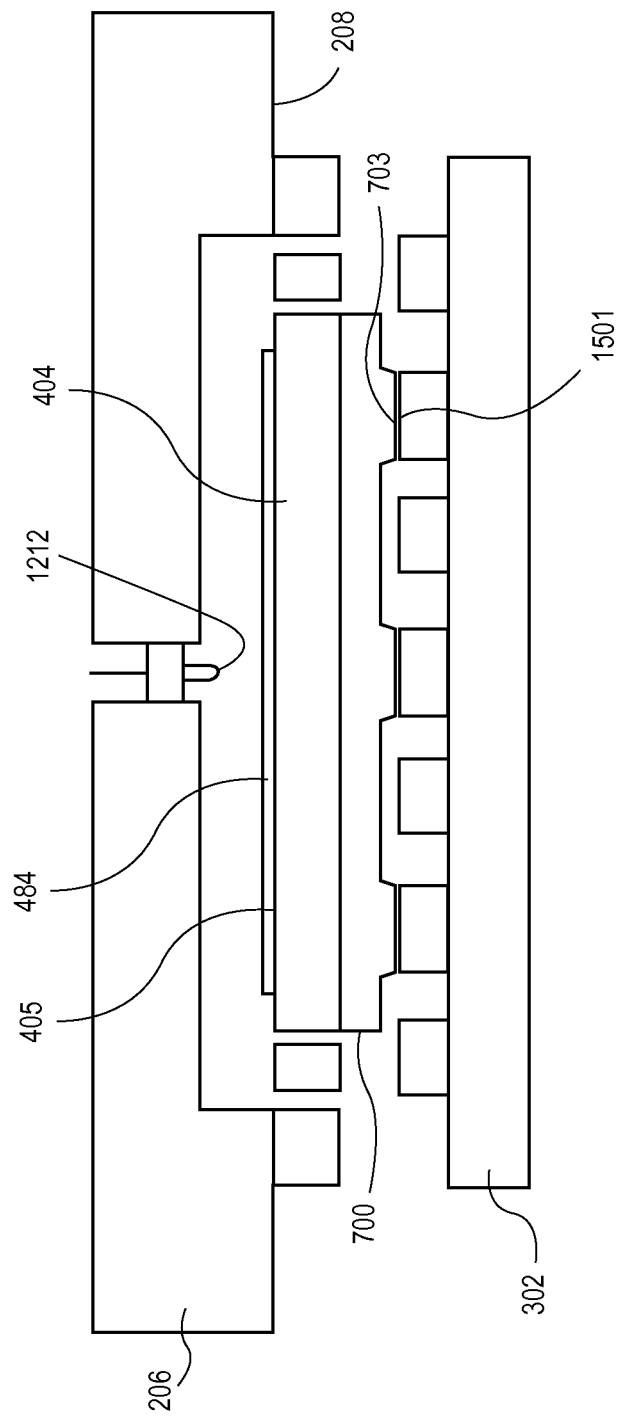
FIG. 15B is a cross-sectional side view illustration of a micro device transfer system having an array of electrostatic transfer heads contacting an array of micro devices on a carrier substrate in accordance with an embodiment of the invention.

Referring again to FIG. 14, at operation 1405, electrostatic transfer heads 703 carried on micro pick up array 700 contact an array of micro devices 1501 on carrier substrate 302. Referring to FIG. 15B, a cross-sectional side view illustration of a micro device transfer system having an array of electrostatic transfer heads contacting an array of micro devices on a carrier substrate is shown in accordance with an embodiment of the invention. As an example, mass transfer tool 100 actuators have moved transfer head assembly 206 toward carrier substrate 302 until the gap between the array of micro devices 1501 and electrostatic transfer heads 703 has closed. However, pivot platform 404 remains undeflected, and therefore, the gap between sensor 1212 and the upper surface 405 of pivot platform 404 remains unchanged from the state shown in FIG. 15A. Although shown in alignment, at this point one or more electrostatic transfer heads 703 may not be in contact with the array of micro devices 1501.

Figure 15C:
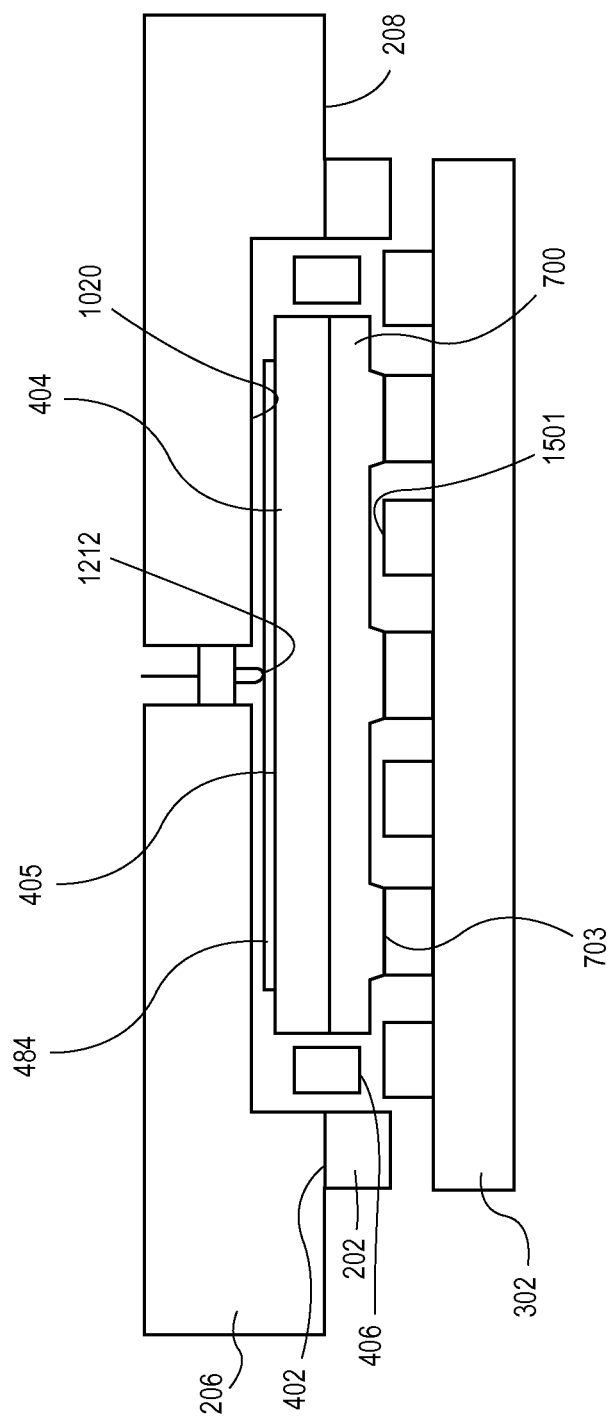
FIG. 15C is a cross-sectional side view illustration of a micro device transfer system having a micro pick up array mount deflecting toward a transfer head assembly in accordance with an embodiment of the invention.

Referring again to FIG. 14, at operation 1410, pivot platform 404 of micro pick up array mount 202 deflects toward transfer head assembly 206 as the transfer head assembly 206 continues to move toward the carrier substrate. Referring to FIG. 15C, a cross-sectional side view illustration of a micro device transfer system having a micro pick up array mount deflecting toward a transfer head assembly is shown in accordance with an embodiment of the invention. As shown, the upper surface 405 of pivot platform 404 has contacted and depressed sensor(s) 1212. Base 402 has remained in contact with mounting surface 208 of transfer head assembly 206. However, beam 406 has bent and/or twisted to enable pivot platform 404 to deflect toward sensor(s) 1212.

Referring again to FIG. 14, at operation 1415, the deflection of pivot platform 404 is sensed. As shown in FIG. 15C, sensor 1212 is contacted and depressed by upper surface of pivot platform 404. The depression of sensor 1212 may trigger a signal transmission to computer system 150, the signal indicating that pivot platform 404 has deflected. Sensor 1212 may detect a single location on pivot platform 404. Thus, in an embodiment, sensor 1212 indicates whether pivot platform 404 has deflected, but may not indicate whether the deflection is uniform across the entire pivot platform 404. However, in an alternative embodiment, several sensors 1212 may be used, and thus, additional information regarding the orientation of pivot platform 404 may be evaluated and supplied to computer system 150 to further control movement of mass transfer tool 150 and the micro device transfer system.

At operation 1420, relative movement between transfer head assembly 206 and carrier substrate 302 may be stopped. In an embodiment, as shown in FIG. 15C, pivot platform 404 has deflected with an upper surface 405 nearly parallel to recessed surface 1020. However, in other embodiments, pivot platform 404 may be tilted relative to recessed surface 1020. Relative movement between transfer head assembly 206 and carrier substrate 302 may be stopped immediately upon detecting deflection of pivot platform 404, or movement of transfer head assembly 206 can be continued after and detection prior to stopping the relative movement. For example, computer system 150 can control actuators of mass transfer tool 100 to cause movement of transfer head assembly 206 for a predetermined time or distance after detecting deflection. This additional range of motion following detection may ensure that complete contact is made between all, or almost all, of the electrostatic transfer heads and micro devices. Thus, detection of deflection can be an input in a chain of inputs that lead to halting movement of the transfer head assembly 206.

In accordance with embodiments of the invention, information obtained from the sensor(s) 1212 can be used to operate the mass transfer tool 100 in a variety of fashions. In one embodiment, the tool may be operated in a drive to contact fashion in which the relative movement between the transfer head assembly 206 and carrier substrate stops only when all sensors have detected deflection. In another embodiment, relative movement is continued a set distance after a specific number of sensors have detected deflection. By way of example, once a first sensor or all of the sensors have detected deflection, the relative movement may be continued for a set distance such as 10 nm to 1 μm. The set distance may vary based upon size of the micro devices, size of the electrostatic transfer heads, as well as the size and elastic modulus of the micro pick up array mount 202. In another embodiment, relative movement is stopped as soon as deflection is detected by any sensor. In yet another embodiment, upon detection of deflection of only a subset of the sensors, the transfer head assembly 206 may be actuated to further align the pivot platform 404 with the carrier substrate plane by tipping or tilting the transfer head assembly 206.

Still referring to FIG. 15C, the movement of transfer head assembly 206 may be stopped in a state where each electrostatic transfer head 703 is in contact with an apposing micro device 1501. In some embodiments or instances, this may not occur. However, in at least one embodiment, the deflection of pivot platform 404 facilitates this uniform contact to allow transferring an array of micro devices 1501 completely without damaging electrostatic transfer heads 703 or micro devices 1501.

Referring again to FIG. 14, at operation 1425, a voltage may be applied to the array of electrostatic transfer heads 703 to create a grip pressure on the corresponding array of micro devices 1501 on carrier substrate 302. As shown in FIG. 15C, with electrostatic transfer heads 703 placed in contact with micro devices 1501, an electrostatic voltage may be applied to electrostatic transfer heads 703 through various contacts and connectors, e.g., vias and traces, of the micro pick up array mount 202 and micro pick up array 700. More specifically, voltage may be transmitted from electrostatic voltage source 1062, through the electrostatic voltage source connection 1060 of transfer head assembly 206, through base electrostatic voltage source connection 433 and pivot platform electrostatic voltage source contact 420 into substrate electrostatic voltage source contact 722 before reaching electrostatic transfer heads 703. As a result, a gripping pressure is applied to the array of micro devices 1501 from the array of electrostatic transfer heads 703.

Figure 15D:
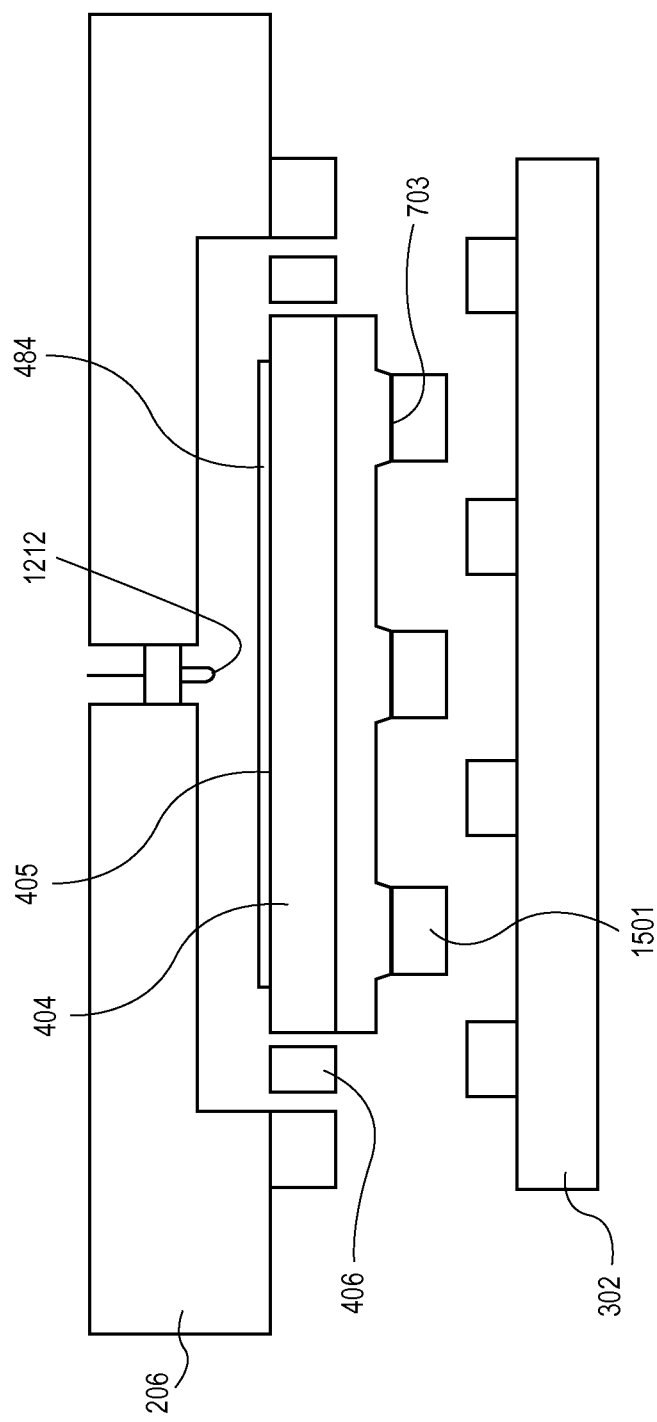
FIG. 15D is a cross-sectional side view illustration of a micro device transfer system having an array of electrostatic transfer heads picking up an array of micro devices from a carrier substrate in accordance with an embodiment of the invention.

Referring again to FIG. 14, at operation 1430, the array of micro devices on carrier substrate 302 is picked up from carrier substrate 302. Referring to FIG. 15D, a cross-sectional side view illustration of a micro device transfer system having an array of electrostatic transfer heads picking up an array of micro devices from a carrier substrate is shown in accordance with an embodiment of the invention. Actuators of mass transfer 100 may be controlled by computer system 150 to cause transfer head assembly 206 to retract from carrier substrate 302. During retraction, pivot platform 404 may return toward an undeflected state, as beams 406 release stored energy and spring back to an initial configuration. Simultaneously, sensor 1212 may extend past recessed surface 1020 to an initial configuration. During pick up, the electrostatic voltage supplied to electrostatic transfer heads 703 persists, and thus, micro devices 1501 are retained on electrostatic transfer heads 703 and removed from carrier substrate 302, once transfer head assembly 206 is sufficiently retracted.

During the pick up process described with respect to FIG. 14, heating element 484 on micro pick up array mount 202 may be heated. For example, heating element 484 can be resistively heated to transfer heat to micro pick up array 700 and to micro devices in contact with electrostatic transfer heads 210. Heat transfer can occur before, during, and after picking up the array of micro devices from carrier substrate 302.

Following pick up of micro devices 1501 from carrier substrate 302, mass transfer tool 100 may be controlled by computer system 150 to move micro devices 1501 toward a receiving substrate in order to complete the transfer of the micro devices. For example, actuators and sensors of mass transfer tool 100 may be used to position transfer head assembly 206 over a receiving substrate held by a receiving substrate holder 124. After re-positioning the transfer head assembly 206 to prepare for transferring, the following process may be performed.

Figure 16:
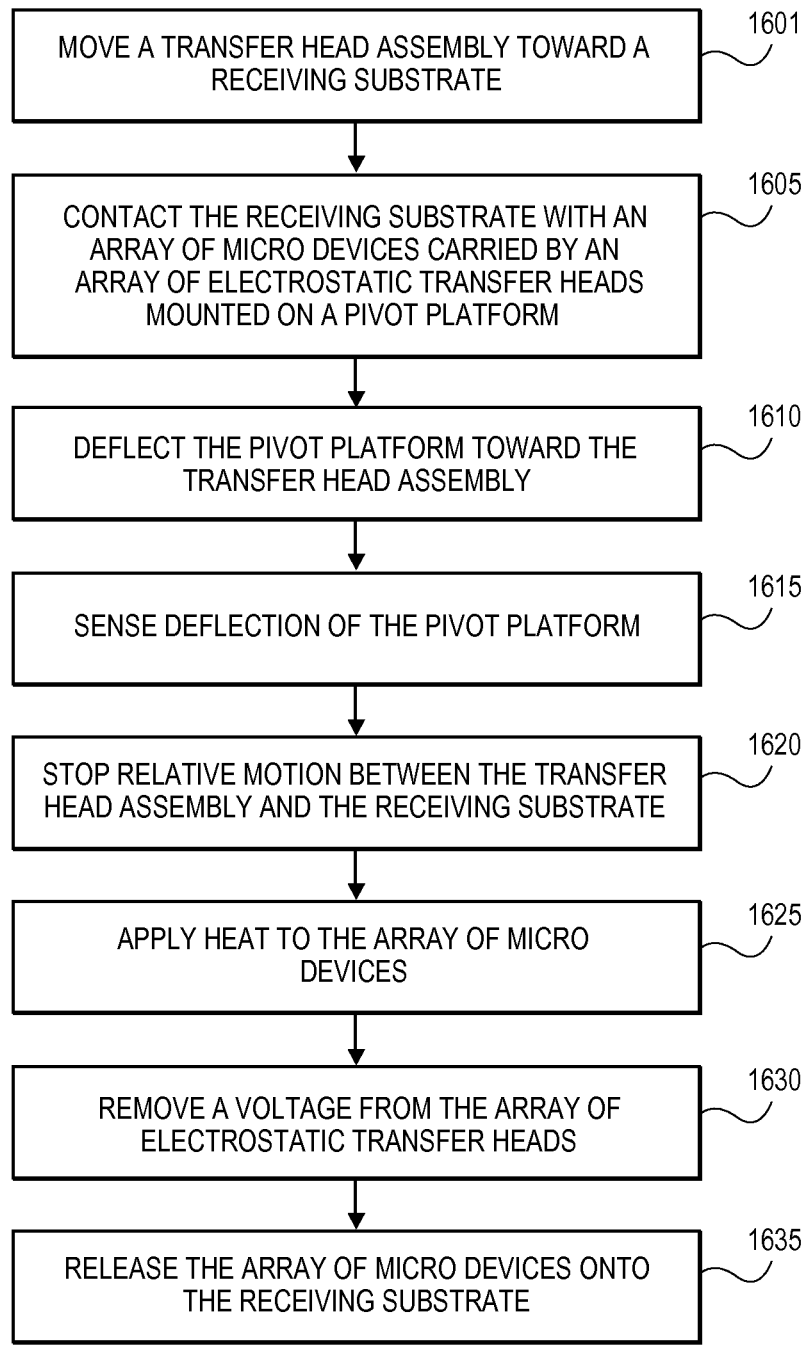
FIG. 16 is a flowchart illustrating a method of releasing an array of micro devices onto a receiving substrate in accordance with an embodiment of the invention.
Figure 17A:
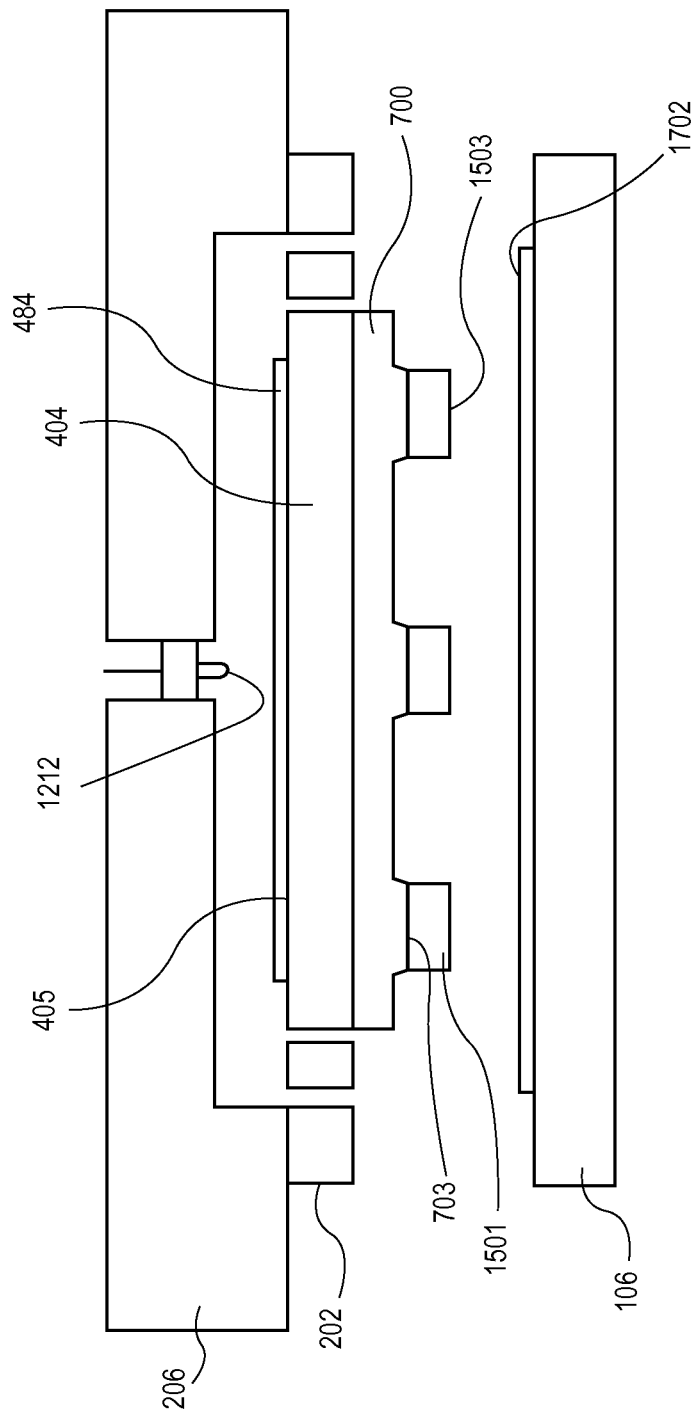
FIG. 17A is a cross-sectional side view illustration of a micro device transfer system having a transfer head assembly moving toward a receiving substrate in accordance with an embodiment of the invention.

Referring to FIG. 16, a flowchart illustrating a method of releasing an array of micro devices onto a receiving substrate is shown in accordance with an embodiment of the invention. For illustrational purposes, the following description of FIG. 16 is also made with reference to the embodiments illustrated in FIGS. 17A-17C. At operation 1601, transfer head assembly 206 is moved toward a receiving substrate on receiving substrate holder 124. Referring to FIG. 17A, a cross-sectional side view illustration of a micro device transfer system having a transfer head assembly moving toward a receiving substrate is shown in accordance with an embodiment of the invention. Pivot platform 404 may be undeflected, with a gap between an upper surface 405 of pivot platform 404 and one or more sensors 1212. The micro pick up array 700 may be mounted on micro pick up array mount 202, which is retained against transfer head assembly 206 in one of the manners described above. Furthermore, array of electrostatic transfer heads 703 grips array of micro devices 1501, however, a gap exists between array of micro devices 1501 and receiving substrate 1702. In this state, transfer head assembly 206 may be moved toward receiving substrate 1702 by mass transfer tool 100 under the control of computer system 150.

Figure 17B:
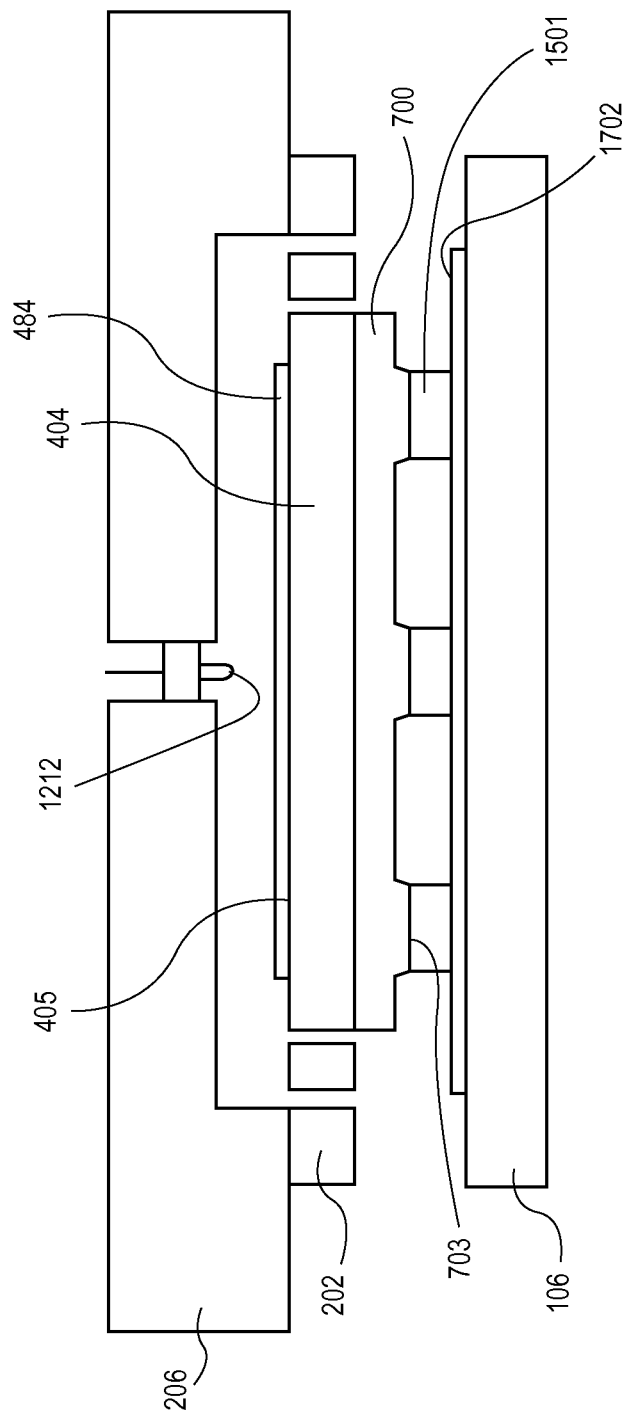
FIG. 17B is a cross-sectional side view illustration of a micro device transfer system having an array of electrostatic transfer heads carrying an array of micro devices contacting a receiving substrate in accordance with an embodiment of the invention.

Referring again to FIG. 16, at operation 1605, the array of micro devices carried by electrostatic transfer heads 703 contacts the receiving substrate. The micro pick up array 700 may be mounted on micro pick up array mount 202, which may be held against transfer head assembly 206 in one of the manners described above. Referring to FIG. 17B, a cross-sectional side view illustration of a micro device transfer system having an array of electrostatic transfer heads carrying an array of micro devices contacting a receiving substrate is shown in accordance with an embodiment of the invention. Transfer head assembly 206 has moved toward receiving substrate 1702 until the gap between the array of micro devices 1501 and receiving substrate 1702 has closed. However, pivot platform 404 remains undeflected, and therefore, the gap between sensor 1212 and the upper surface of pivot platform 404 remains unchanged from the state shown in FIG. 17A. Although shown in alignment, at this point one or more micro devices 1501 may not be in contact with receiving substrate 1702.

Figure 17C:
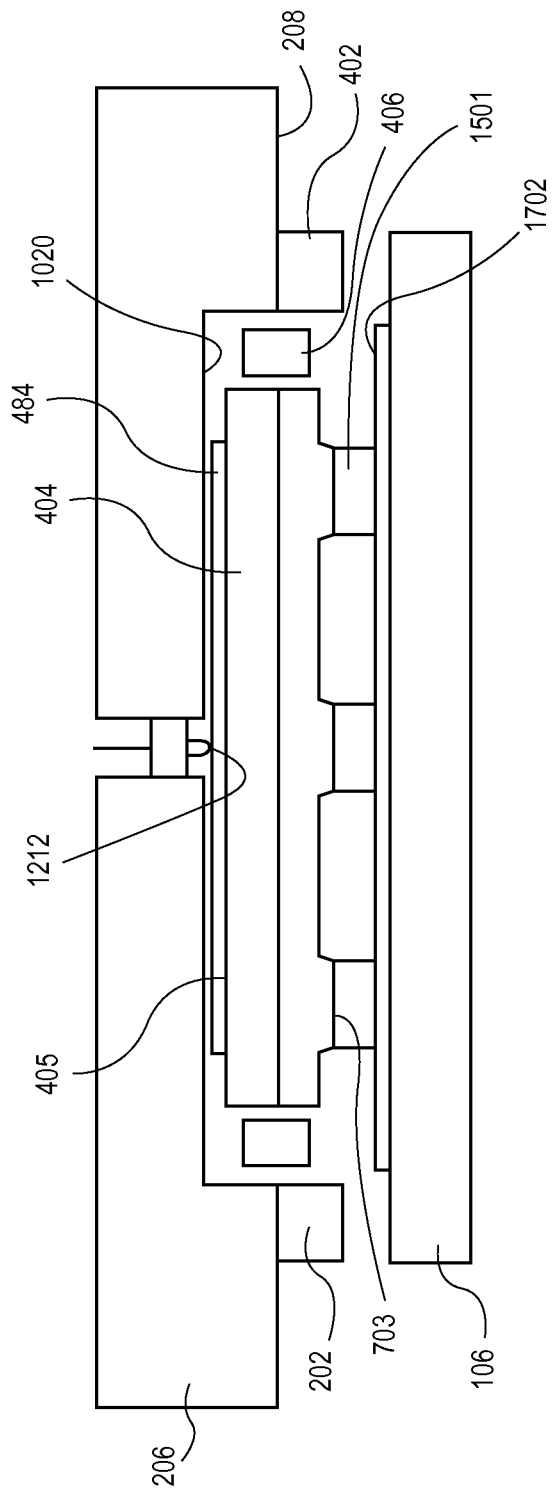
FIG. 17C is a cross-sectional side view illustration of a micro device transfer system having a micro pick up array mount deflecting toward a transfer head assembly in accordance with an embodiment of the invention.

Referring again to FIG. 16, at operation 1610, pivot platform 404 of micro pick up array mount 202 deflects toward transfer head assembly 206 as the transfer head assembly 206 continues to move toward the carrier substrate. Referring to FIG. 17C, a cross-sectional side view illustration of a micro device transfer system having a micro pick up array mount deflecting toward a transfer head assembly is shown in accordance with an embodiment of the invention. As shown, the upper surface 405 of pivot platform 404 has contacted and depressed sensor(s) 1212. Base 402 has remained in contact with mounting surface 208 of transfer head assembly 206. However, beam 406 has bent or twisted to deflect away from receiving substrate 1702 such that pivot platform 404 deflects toward sensor(s) 1212.

Referring again to FIG. 16, at operation 1615, the deflection of pivot platform 404 may be sensed. As shown in FIG. 17C, sensor 1212 is contacted and depressed by upper surface of pivot platform 404. The depression of sensor 1212 may trigger a signal transmission to computer system 150, the signal indicating that pivot platform 404 has deflected. Sensor 1212 may detect a single location on pivot platform 404. Thus, in an embodiment, sensor 1212 indicates whether pivot platform 404 has deflected, but may not indicate whether the deflection is uniform across the entire pivot platform 404. However, in an alternative embodiment, several sensors 1212 may be used, and thus, additional information regarding the orientation of pivot platform 404 may be evaluated and supplied to computer system 150 to control movement of mass transfer tool 150 and the micro device transfer system.

In an embodiment, such as the one shown in FIG. 17C, pivot platform 404 has deflected with an upper surface 405 nearly parallel to recessed surface 1020. However, in other embodiments, pivot platform 404 may be tilted relative to recessed surface 1020. Relative movement between transfer head assembly 206 and carrier substrate 302 may be stopped at operation 1620 in a variety of embodiments. For example, relative movement may be stopped immediately upon detecting deflection of pivot platform 404, or movement of transfer head assembly 206 can be continued after detection. Computer system 150 can control mass transfer tool 100 to move transfer head assembly 206 for a predetermined time or distance after detecting deflection. This additional range of motion following detection may ensure that complete contact is made between all, or almost all, of the micro devices and the receiving substrate. Thus, detection of deflection can be an input in a chain of inputs that lead to halting movement of the transfer head assembly 206.

In accordance with embodiments of the invention, information obtained from the sensor(s) 1212 can be used to operate the mass transfer tool 100 in a variety of fashions. In one embodiment, the tool may be operated in a drive to contact fashion in which the relative movement between the transfer head assembly 206 and receiving substrate stops only when all sensors have been detected deflection. In another embodiment, relative movement is continued a set distance after a specific number of sensors have detected deflection. By way of example, once a first sensor or all of the sensors have detected deflection, the relative movement may be continued for a set distance such as 10 nm to 1 μm. The set distance may vary based upon size of the micro devices, electrostatic transfer heads, as well as the size and elastic modulus of the micro pick up array mount 202. In another embodiment, relative movement is stopped as soon as deflection is detected by any sensor. In yet another embodiment, upon detection of deflection of only a subset of the sensors, the transfer head assembly 206 may be actuated to further align the pivot platform 404 with the receiving substrate plane by tipping or tilting the transfer head assembly 206 or receiving substrate.

Referring again to FIG. 16, at operation 1625, heat may be applied to the array of micro devices. For example, heating element 484 may be resistively heated as described above to transfer heat through micro pick up array mount 202 into the array of electrostatic transfer heads 703 that appose micro devices 1501. Micro devices 1501 may be heated throughout the placement process described with respect to FIG. 16. Maintaining an elevated temperature of micro pick up array mount 202 in this manner can avoid some problems that arise from temperature variations in an operating environment. However, more particularly, micro devices 1501 may be heated after deflection of pivot platform 404 is sensed and/or after micro devices 1501 are in contact with receiving substrate 1702. In an embodiment, each electrostatic transfer head 703 in the array is heated uniformly, e.g., to a temperature of 50 degrees Celsius, 180 degrees Celsius, 200 degrees Celsius, or even up to 350 degrees Celsius. These temperatures can cause melting or diffusion between micro devices 1501 and receiving substrate 1702.

Referring again to FIG. 16, at operation 1630, the voltage may be removed from the array of electrostatic transfer heads 703. As shown in FIG. 17C, with micro devices 1501 in contact with receiving substrate 1702, the electrostatic voltage may be removed from electrostatic transfer heads 703. For example, the electrostatic voltage was applied to electrostatic transfer heads 703 through various contacts and connectors, e.g., vias and traces of the micro pick up array mount 202 and micro pick up array 700 may be discontinued or removed.

Figure 17D:
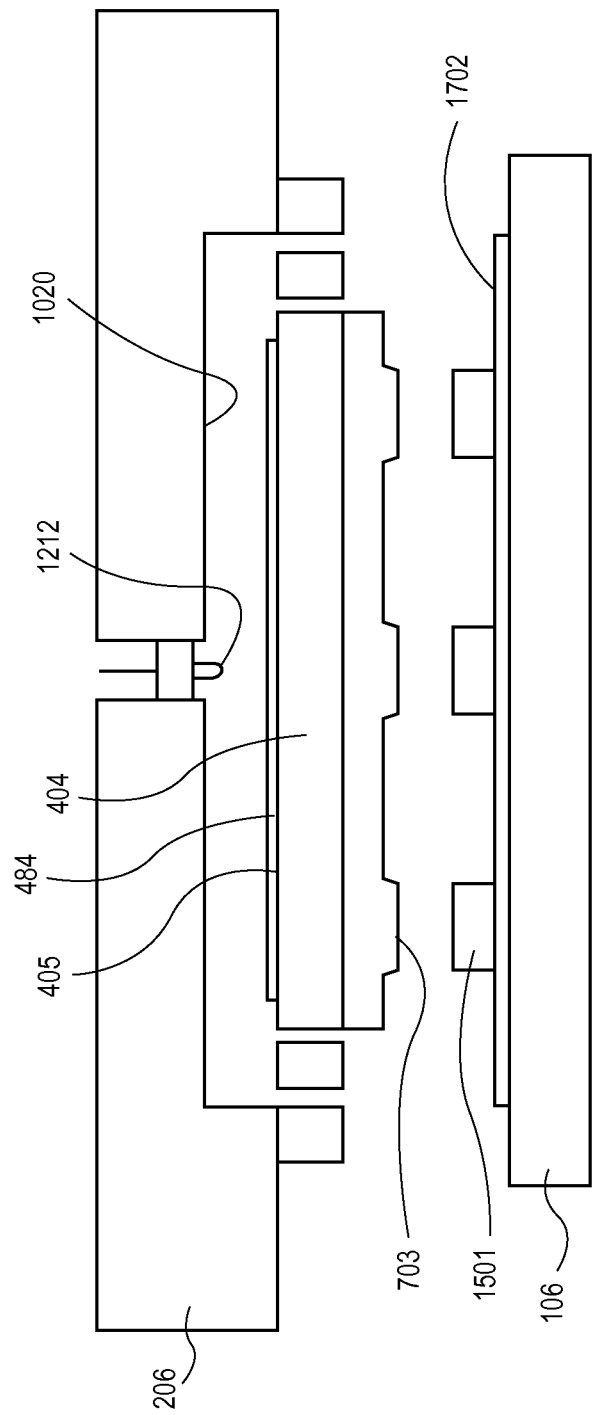
FIG. 17D is a cross-sectional side view illustration of a micro device transfer system releasing an array of micro devices onto a receiving substrate from an array of electrostatic transfer heads in accordance with an embodiment of the invention.

Referring again to FIG. 16, at operation 1635, the array of micro devices may be released onto the receiving substrate. Referring to FIG. 17D, a cross-sectional side view illustration of a micro device transfer system releasing an array of micro devices onto a receiving substrate from an array of electrostatic transfer heads is shown in accordance with an embodiment of the invention. After electrostatic voltage is removed from electrostatic transfer heads 703, the grip pressure between electrostatic transfer heads 703 and micro devices 1501 is attenuated, and thus micro devices 1501 may release onto an adjacent surface of receiving substrate 1702. Following release of micro devices 1501, mass transfer tool 100 may be controlled to retract transfer head assembly 206 from receiving substrate 1702. During retraction, pivot platform 404 may return toward an undeflected state, as beams 406 spring back to an initial configuration. Simultaneously, sensor 1212 may extend past recessed surface 1020 to an initial configuration.

Transfer head assembly 206 may continue to lift away from receiving substrate 1702. Thus, a gap will occur between electrostatic transfer heads 703 and micro devices 1501, as micro devices 1501 are released onto receiving substrate 1702. Subsequently, transfer head assembly 206 may be moved back toward carrier substrate 302 to continue the transfer process by transferring another array of micro devices 1501, as described above.

Figure 18:
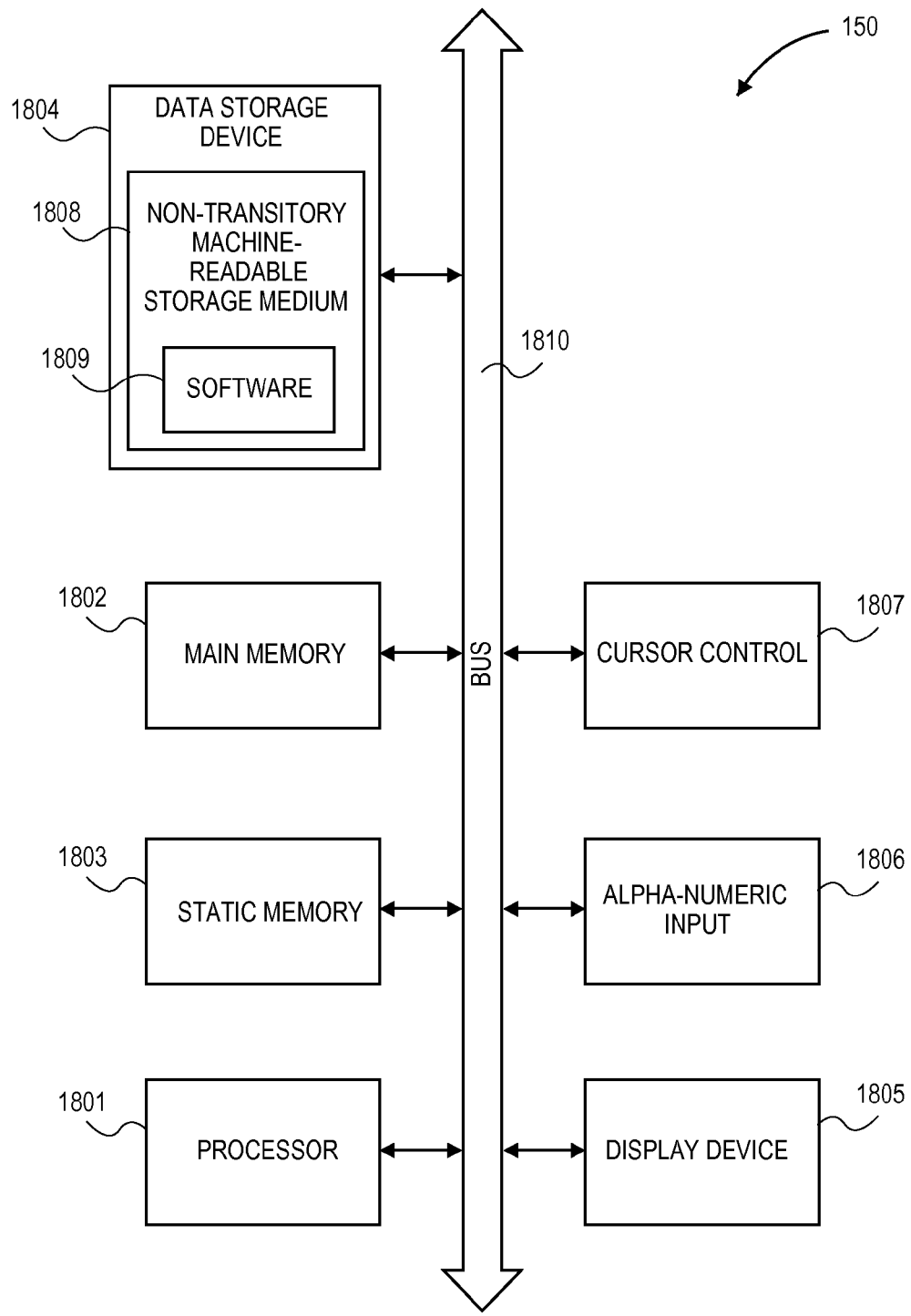
FIG. 18 is a schematic illustration of an exemplary computer system that may be used in accordance with an embodiment of the invention.

Referring to FIG. 18, a schematic illustration of an exemplary computer system that may be used is shown in accordance with an embodiment of the invention. Portions of embodiments of the invention are comprised of or controlled by non-transitory machine-readable and machine-executable instructions which reside, for example, in machine-usable media of a computer control system 150. Computer system 150 is exemplary, and that embodiments of the invention may operate on or within, or be controlled by a number of different computer systems including general purpose networked computer systems, embedded computer systems, routers, switches, server devices, client devices, various intermediate devices/nodes, stand-alone computer systems, and the like.

Computer system 150 of FIG. 18 includes an address/data bus 1810 for communicating information, and a central processor unit 1801 coupled to bus 1810 for processing information and instructions. System 150 also includes data storage features such as a computer usable volatile memory 1802, e.g. random access memory (RAM), coupled to bus 1810 for storing information and instructions for central processor unit 1801, computer usable non-volatile memory 1803, e.g. read only memory (ROM), coupled to bus 1810 for storing static information and instructions for the central processor unit 1801, and a data storage device 1804 (e.g., a magnetic or optical disk and disk drive) coupled to bus 1810 for storing information and instructions. System 150 of the present embodiment also includes an optional alphanumeric input device 1806 including alphanumeric and function keys coupled to bus 1810 for communicating information and command selections to central processor unit 1801. System 150 also optionally includes an optional cursor control device 1807 coupled to bus 1810 for communicating user input information and command selections to central processor unit 1801. System 150 of the present embodiment also includes an optional display device 1805 coupled to bus 1810 for displaying information.

The data storage device 1804 may include a non-transitory machine-readable storage medium 1808 on which is stored one or more sets of instructions (e.g. software 1809) embodying any one or more of the methodologies or operations described herein. Software 1809 may also reside, completely or at least partially, within the volatile memory 1802, non-volatile memory 1803, and/or within processor 1801 during execution thereof by the computer system 150, the volatile memory 1802, non-volatile memory 1803, and processor 1801 also constituting non-transitory machine-readable storage media.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A micro pick up array mount comprising:
   a pivot platform having a mounting surface configured to mount a micro pick up array, wherein the pivot platform includes a pivot platform electrostatic voltage source contact on the mounting surface;
   a base laterally around the mounting surface of the pivot platform, wherein the pivot platform is movable relative to the base;
   a beam between the pivot platform and the base, wherein the beam is physically coupled with the pivot platform at an inner pivot and physically coupled with the base at an outer pivot;
   a heating contact on the base; and
   a heating element on the pivot platform in electrical connection with the heating contact.

2. The micro pick up array mount of claim 1, wherein the outer pivot is on a base edge and the inner pivot is on a pivot platform edge, and wherein the base edge is orthogonal to the pivot platform edge.

3. The micro pick up array mount of claim 2, further comprising a second beam coupled with the base by a second outer pivot on a second base edge and coupled with the pivot platform by a second inner pivot on a second pivot platform edge.

4. The micro pick up array mount of claim 2, wherein the beam is coupled with the pivot platform at a second inner pivot and coupled with the base at a second outer pivot.

5. The micro pick up array mount of claim 4, wherein the inner pivot is across the pivot platform from the second inner pivot, and wherein the outer pivot is across the pivot platform from the second outer pivot.

6. The micro pick up array mount of claim 1, wherein the inner pivot and outer pivot comprise silicon.

7. The micro pick up array mount of claim 1, further comprising:
   a base electrostatic voltage source contact on the base, the pivot platform electrostatic voltage source contact in electrical connection with the base electrostatic voltage source contact.

8. The micro pick up array mount of claim 7, further comprising:
   a trace extending from the pivot platform electrostatic voltage source contact, the pivot platform electrostatic voltage source contact in electrical connection with the base electrostatic voltage source contact through the trace.

9. The micro pick up array mount of claim 1, further comprising a bonding site on the mounting surface of the pivot platform.

10. The micro pick up array mount of claim 9, wherein the bonding site comprises a clamp electrode.

11. The micro pick up array mount of claim 10, further comprising a base clamp contact on the base, the clamp electrode in electrical connection with the base clamp contact.

12. The micro pick up array mount of claim 11, further comprising:
   a trace extending from the clamp electrode, the clamp electrode in electrical connection with the base clamp contact through the trace.

13. The micro pick up array mount of claim 9, wherein the bonding site comprises a metal selected from the group consisting of: gold, copper, and aluminum.

14. The micro pick up array mount of claim 1, further comprising a temperature sensor on the pivot platform.

15. The micro pick up array mount of claim 1, wherein the heating element is placed to distribute heat throughout the pivot platform.

16. The micro pick up array mount of claim 1, wherein the heating element is on a pivot platform surface.

17. The micro pick up array mount of claim 16, wherein the pivot platform surface is opposite from the mounting surface.

18. The micro pick up array mount of claim 1 further comprising a lamination over the heating element to direct heat into the pivot platform.

19. The micro pick up array mount of claim 1 further comprising a heating lead, wherein the heating contact is electrically connected to the heating element by the heating lead, and wherein the heating lead extends over the beam.

20. A micro device transfer system comprising:
   a micro pick up array mount including:
      a pivot platform having a mounting surface, wherein the pivot platform includes a pivot platform electrostatic voltage source contact on the mounting surface,
      a base laterally around the mounting surface of the pivot platform, wherein the pivot platform is movable relative to the base,
      a beam between the pivot platform and the base, wherein the beam is physically coupled with the pivot platform at an inner pivot and physically coupled with the base at an outer pivot,
      a heating contact on the base, and
      a heating element on the pivot platform in electrical connection with the heating contact; and
   a micro pick up array having a substrate supporting an array of electrostatic transfer heads, the micro pick up array mountable on the mounting surface of the micro pick up array mount.

21. The micro device transfer system of claim 20, wherein the outer pivot is on a base edge and the inner pivot is on a pivot platform edge, and wherein the base edge is orthogonal to the pivot platform edge.

22. The micro device transfer system of claim 21, further comprising a second beam coupled with the base by a second outer pivot on a second base edge and coupled with the pivot platform by a second inner pivot on a second pivot platform edge.

23. The micro device transfer system of claim 21, wherein the beam is coupled with the pivot platform at a second inner pivot and coupled with the base at a second outer pivot.

24. The micro device transfer system of claim 23, wherein the inner pivot is across the pivot platform from the second inner pivot, and wherein the outer pivot is across the pivot platform from the second outer pivot.

25. The micro device transfer system of claim 20, wherein the inner pivot and outer pivot comprise silicon.

26. The micro device transfer system of claim 20, wherein each electrostatic transfer head comprises a mesa structure including a top surface having a surface area in a range of 1 to 10,000 square micrometers.

27. The micro device transfer system of claim 20, wherein:
   the micro pick up array further includes an electrode, and a substrate electrostatic voltage source contact on the substrate, the substrate electrostatic voltage source connection in electrical connection with the electrode; and
   the micro pick up array mount further includes a base electrostatic voltage source contact on the base, the pivot platform electrostatic voltage source contact in electrical connection with the base electrostatic voltage source contact.

28. The micro device transfer system of claim 27, wherein:
the micro pick up array mount further includes a first trace extending from the pivot platform electrostatic voltage source contact, the pivot platform electrostatic voltage source contact in electrical connection with the base electrostatic voltage source contact through the first trace; and
the micro pick up array further includes a second trace extending from the substrate electrostatic voltage source contact, the substrate electrostatic voltage source contact in electrical connection with the electrode through the second trace.

29. The micro device transfer system of claim 28, wherein the substrate electrostatic voltage source contact aligns with the pivot platform electrostatic voltage source contact to place the electrode in electrical connection with the base electrostatic voltage source contact.

30. The micro device transfer system of claim 20, further comprising:
a base clamp contact on the base; and
a clamp electrode on the pivot platform, the clamp electrode in electrical connection with the base clamp contact.

31. The micro device transfer system of claim 30, further comprising:
a trace extending from the clamp electrode, the clamp electrode in electrical connection with the base clamp contact through the trace.

32. The micro device transfer system of claim 31, wherein the clamp electrode aligns with the substrate to electrostatically bond the micro pick up array to the pivot platform when voltage is applied to the clamp electrode from the base clamp contact through the trace.

33. The micro device transfer system of claim 20, wherein the micro pick up array is attached to the pivot platform by a permanent bond.

34. The micro device transfer system of claim 33, wherein the permanent bond comprises a thermocompression bond.

35. The micro device transfer system of claim 20, wherein the micro pick up array mount further includes a temperature sensor on the pivot platform.

36. The micro device transfer system of claim 20, wherein the heating element is placed to distribute heat throughout the pivot platform.

37. The micro device transfer system of claim 20, wherein the heating element is on a pivot platform surface.

38. The micro device transfer system of claim 37, wherein the pivot platform surface is opposite from the mounting surface.

39. The micro device transfer system of claim 20 further comprising a lamination over the heating element to direct heat into the pivot platform.

40. The micro device transfer system of claim 20 further comprising a heating lead, wherein the heating contact is electrically connected to the heating element by the heating lead, and wherein the heating lead extends over the beam.

41. A micro device transfer system comprising:
a transfer head assembly including a mounting surface;
a micro pick up array mount including:
a pivot platform having a micro pick up array mounting surface, wherein the pivot platform includes a pivot platform electrostatic voltage source contact on the micro pick up array mounting surface,
a base laterally around the micro pick up array mounting surface of the pivot platform, wherein the pivot platform is movable relative to the base,
a beam that connects the base with the pivot platform, wherein the beam is physically coupled with the pivot platform at an inner pivot and physically coupled with the base at an outer pivot,
a heating contact on the base, and
a heating element on the pivot platform in electrical connection with the heating contact; and
a micro pick up array mountable on the micro pick up array mounting surface, the micro pick up array including a substrate supporting an array of electrostatic transfer heads;
wherein the pivot platform is deflectable toward the transfer head assembly when the base is mounted on the mounting surface and the micro pick up array is mounted on the micro pick up array mounting surface of the pivot platform.

42. The micro device transfer system of claim 41, wherein the transfer head assembly further includes a sensor to detect deflection of the pivot platform toward the transfer head assembly.

43. The micro device transfer system of claim 42, wherein the sensor is a contact sensor to sense a deflected position of the pivot platform.

44. The micro device transfer system of claim 43, wherein the contact sensor comprises a switch.

45. The micro device transfer system of claim 42, wherein the sensor is a motion sensor to sense movement of the pivot platform.

46. The micro device transfer system of claim 41 wherein:
the transfer head assembly further includes an electrostatic voltage source connection;
the micro pick up array mount further includes a base electrostatic voltage source contact; and
the micro pick up array further includes a substrate electrostatic voltage source contact;
wherein the electrostatic voltage source connection and the base electrostatic voltage source contact are aligned, and wherein the pivot platform electrostatic voltage source contact and substrate electrostatic voltage source contact are aligned.

47. The micro device transfer system of claim 46, wherein:
the transfer head assembly further includes a vacuum port coupled with a vacuum source to apply suction to the micro pick up array mount and a clamping voltage source connection; and
the micro pick up array mount further includes a clamp electrode on the pivot platform to apply an electrostatic force to the micro pick up array.

48. The micro device transfer system of claim 47, wherein the micro pick up array mount further includes a base clamp contact on the base, the clamp electrode in electrical connection with the base clamp contact.

49. The micro device transfer system of claim 48, wherein the micro pick up array mount further includes a trace extending from the clamp electrode, the clamp electrode in electrical connection with the base clamp contact through the trace.

50. The micro device transfer system of claim 49, wherein the clamp voltage source connection and the base clamp contact are aligned, and wherein the substrate and the clamp electrode are aligned to electrostatically bond the micro pick up array to the pivot platform when voltage is applied to the clamp electrode from the clamping voltage source connection through the base clamp.

51. The micro device transfer system of claim 46, wherein:
the transfer head assembly further includes a holding electrode coupled to an electrostatic voltage source to apply an electrostatic force to the micro pick up array mount and a clamping voltage source connection; and the micro pick up array mount further includes a clamp electrode on the pivot platform to apply an electrostatic force to the micro pick up array.

52. The micro device transfer system of claim 51, wherein the micro pick up array mount further includes a base clamp contact on the base and a clamp electrode on the pivot platform, the clamp electrode in electrical connection with the base clamp contact.

53. The micro device transfer system of claim 52, wherein the micro pick up array mount further includes a trace extending from the clamp electrode, the clamp electrode in electrical connection with the base clamp contact through the trace.

54. The micro device transfer system of claim 53, wherein the clamp voltage source connection and the base clamp contact are aligned, and wherein the substrate and the clamp electrode are aligned to electrostatically bond the micro pick up array to the pivot platform when voltage is applied to the clamp electrode from the clamping voltage source connection through the base clamp.

55. The micro device transfer system of claim 46, wherein the micro pick up array is attached to the pivot platform by a permanent bond.

56. The micro device transfer system of claim 55, wherein the permanent bond comprises a thermocompression bond.

57. The micro device transfer system of claim 41, wherein each electrostatic transfer head comprises a mesa structure including a top surface having a surface area in a range of 1 to 10,000 square micrometers.

58. The micro device transfer system of claim 41, wherein:
the transfer head assembly further includes a heating connection.

59. The micro device transfer system of claim 41, wherein the heating element is placed to distribute heat throughout the pivot platform.

60. The micro device transfer system of claim 41, wherein the heating element is on a pivot platform surface.

61. The micro device transfer system of claim 60, wherein the pivot platform surface is opposite from the micro pick up array mounting surface.

62. The micro device transfer system of claim 41 further comprising a lamination over the heating element to direct heat into the pivot platform.

63. The micro device transfer system of claim 41 further comprising a heating lead, wherein the heating contact is electrically connected to the heating element by the heating lead, and wherein the heating lead extends over the beam.

* * * * *